(12) United States Patent
Tak et al.

(10) Patent No.: US 10,096,688 B2
(45) Date of Patent: Oct. 9, 2018

(54) INTEGRATED CIRCUIT DEVICE AND METHOD OF MANUFACTURING THE SAME

(71) Applicant: Samsung Electronics Co., Ltd., Suwon-si, Gyeonggi-do (KR)

(72) Inventors: Yong-suk Tak, Seoul (KR); Gi-gwan Park, Suwon-si (KR); Tae-jong Lee, Hwaseong-si (KR); Bon-young Koo, Suwon-si (KR); Ki-yeon Park, Hwaseong-si (KR); Sung-hyun Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 178 days.

(21) Appl. No.: 15/206,868

(22) Filed: Jul. 11, 2016

(65) Prior Publication Data

US 2017/0110554 A1   Apr. 20, 2017

(30) Foreign Application Priority Data

Oct. 15, 2015 (KR) .................. 10-2015-0144321

(51) Int. Cl.
| | |
|---|---|
| *H01L 29/49* | (2006.01) |
| *H01L 29/786* | (2006.01) |
| *H01L 29/423* | (2006.01) |
| *H01L 29/66* | (2006.01) |
| *H01L 29/06* | (2006.01) |

(52) U.S. Cl.
CPC .... *H01L 29/4991* (2013.01); *H01L 29/42392* (2013.01); *H01L 29/66439* (2013.01); *H01L 29/66742* (2013.01); *H01L 29/78696* (2013.01); *H01L 29/0673* (2013.01)

(58) Field of Classification Search
CPC combination set(s) only.
See application file for complete search history.

(56) References Cited

U.S. PATENT DOCUMENTS

| | | | |
|---|---|---|---|
| 8,313,990 | B2 | 11/2012 | Bangsaruntip et al. |
| 8,384,069 | B2 | 2/2013 | Pernel et al. |
| 8,722,492 | B2 | 5/2014 | Bangsaruntip et al. |
| (Continued) | | | |

FOREIGN PATENT DOCUMENTS

KR   10-2006-0046879 A   5/2006

*Primary Examiner* — Ratisha Mehta
(74) *Attorney, Agent, or Firm* — Myers Bigel, P.A.

(57) ABSTRACT

An integrated circuit device includes a fin type active area protruding from a substrate and having an upper surface at a first level; a nanosheet extending in parallel to the upper surface of the fin type active area and comprising a channel area, the nanosheet being located at a second level spaced apart from the upper surface of the fin type active area; a gate disposed on the fin type active area and surrounding at least a part of the nanosheet, the gate extending in a direction crossing the fin type active area; a gate dielectric layer disposed between the nanosheet and the gate; a source and drain region formed on the fin type active area and connected to one end of the nanosheet; a first insulating spacer on the nanosheet, the first insulating spacer covering sidewalls of the gate; and a second insulating spacer disposed between the gate and the source and drain region in a space between the upper surface of the fin type active area and the nanosheet, the second insulating spacer having a multilayer structure.

20 Claims, 57 Drawing Sheets

(56) References Cited

U.S. PATENT DOCUMENTS

| | | |
|---|---|---|
| 8,994,081 B2 | 3/2015 | Leobandung |
| 8,999,797 B2 | 4/2015 | Joung et al. |
| 9,029,834 B2 | 5/2015 | Bangsaruntip et al. |
| 2008/0194065 A1* | 8/2008 | Lee .................. H01L 21/76224 438/151 |
| 2014/0001441 A1* | 1/2014 | Kim .................. H01L 29/0673 257/29 |
| 2014/0042386 A1 | 2/2014 | Cea et al. |
| 2014/0151639 A1 | 6/2014 | Chang et al. |
| 2014/0183451 A1 | 7/2014 | Hirai et al. |
| 2015/0090958 A1 | 4/2015 | Yang et al. |
| 2015/0123213 A1* | 5/2015 | Lin ....................... H01L 27/088 257/401 |
| 2015/0123215 A1 | 5/2015 | Obradovic et al. |

* cited by examiner

INTEGRATED CIRCUIT DEVICE AND METHOD OF MANUFACTURING THE SAME

CROSS-REFERENCE TO RELATED APPLICATION

This application claims the benefit of Korean Patent Application No. 10-2015-0144321, filed on Oct. 15, 2015, in the Korean Intellectual Property Office, the disclosure of which is incorporated herein in its entirety by reference.

BACKGROUND

The inventive concept relates to an integrated circuit device and a method of manufacturing the same, and, more particularly, to an integrated circuit device including a metal-oxide-semiconductor field effect transistor (MOSFET) and a method of manufacturing the same.

As the integration degree of semiconductor devices becomes greater, the size of semiconductor devices has been reduced to an extreme state, and scaling thereof has approached the limit. Accordingly, to reduce an effective switching capacitance (Ceff) in semiconductor devices and enhance the performance thereof, new methods may be needed involving structural changes semiconductor devices.

SUMMARY

The inventive concept provides an integrated circuit device having a structure capable of reducing an effective switching capacitance (Ceff) of the integrated semiconductor device and enhancing performance thereof.

The inventive concept also provides a method of manufacturing an integrated circuit device having a structure capable of reducing an effective switching capacitance (Ceff) of the integrated semiconductor device and enhancing performance thereof.

According to an aspect of the inventive concept, there is provided an integrated circuit device including a fin type active area protruding from a substrate and having an upper surface at a first level; a nanosheet extending in parallel to the upper surface of the fin type active area and including a channel area, the nanosheet being located at a second level spaced apart from the upper surface of the fin type active area; a gate disposed on the fin type active area and surrounding at least a part of the nanosheet, the gate extending in a direction crossing the fin type active area; a gate dielectric layer disposed between the nanosheet and the gate; a source and drain region formed on the fin type active area and connected to one end of the nanosheet; a first insulating spacer on the nanosheet, the first insulating spacer covering sidewalls of the gate; and a second insulating spacer disposed between the gate and the source and drain region in a space between the upper surface of the fin type active area and the nanosheet, the second insulating spacer having a multilayer structure.

The gate may include a main gate portion covering an upper surface of the nanosheet and a sub-gate portion connected to the main gate portion and formed in a space between the fin type active area and the nanosheet. The first insulating spacer may cover sidewalls of the main gate portion. The second insulating spacer may cover sidewalls of the sub-gate portion.

The nanosheet may be formed in an overlap region covered by the gate in a space between the fin type active area and the gate and has a planar area greater than a planar area of the overlap region.

The first insulating spacer and the second insulating spacer may include different materials.

The second insulating spacer may include an air space.

The second insulating spacer may have at least a triple layer structure.

The triple layer structure may include an air space.

The second insulating spacer may include: a first liner having a surface facing the gate and the nanowire and including a first insulating material that does not include oxygen; a second liner spaced apart from the gate and the nanowire and including a second insulating material different from the first insulating material, wherein the first liner is between the second liner and the gate and between the second liner and the nanowire; and an air space having at least a part limited by the second liner.

The second insulating spacer may further include a partial burial layer limiting an air space defined by the second liner.

The second insulating spacer may include: a first liner having a surface facing the gate and the nanowire and including a first insulating material that does not include oxygen; a second liner spaced apart from the gate and the nanowire and including a second insulating material different from the first insulating material, wherein the first liner is between the second liner and the gate and between the second liner and the nanowire; and a burial layer filling at least a part of a space defined by the second liner and including a third insulating material different from the second insulating material.

The second insulating spacer may include: a first liner including one of SiN, SiCN, and SiBN; and a second liner spaced apart from the gate and the nanowire and including one of SiON, SiOCN, and SiBCN, wherein the first liner is between the second liner and the gate and between the second liner and the nanowire.

The second insulating spacer may include: a first liner including a first insulating material that does not include oxygen; and a second liner having a composition different from a composition of the first insulating material and having an oxygen content ranging from 0 to about 50 atom %.

The second insulating spacer may include at least one of an air space, SiN, SiCN, SiBN, SiON, SiOCN, SiBCN, SiOC, and $SiO_2$.

The first insulating spacer may include SiN. The second insulating spacer may include an insulating layer contacting the source and drain region and including SiON.

According to another aspect of the inventive concept, there is provided an integrated circuit device including a fin type active area protruding from a substrate and extending in a first direction; at least one nanosheet stack structure facing and spaced apart from an upper surface of the fin type active area, the at least one nanosheet stack structure including a plurality of nanosheets each having a channel area; at least one gate disposed on the fin type active area and covering the at least one nanosheet stack structure, the at least one gate extending in a direction crossing the first direction; at least one gate dielectric layer disposed between the at least one nanosheet stack structure and the at least one gate; source and drain regions connected to the plurality of nanosheets; and insulating spacers each having a multilayer structure and contacting the source and drain regions in spaces between the plurality of nanosheets.

The at least one gate may include a main gate portion on the plurality of nanosheets and a sub-gate portion filling the spaces between the plurality of nanosheets, the main gate portion having a first thickness and the sub-gate portion having a second thickness smaller than the first thickness. The insulating spacers may cover sidewalls of the sub-gate portion.

The insulating spacers may include an air space.

The insulating spacers may include: a first liner spaced apart from the source and drain regions and including a first insulating material that does not include oxygen; and a second liner contacting the source and drain regions, the second liner having a composition different from a composition of the first insulating material and having an oxygen content ranging from 0 to about 50 atom %.

The plurality of nanosheets may be in at least one overlap region covered by the at least one gate, among spaces between the fin type active area and the at least one gate, and has a planar area greater than a planar area of the at least one overlap region.

The at least one nanosheet stack structure may include a plurality of nanosheet stack structures and the at least one gate includes a plurality of gates, wherein the plurality of nanosheet stack structures are arranged in a line along the first direction on the fin type active area and each includes a plurality of the nanosheets. The plurality of gates may extend in parallel to each other on the fin type active area, the plurality of nanosheet stack structures may be arranged between the fin type active area and the plurality of gates.

According to another aspect of the inventive concept, there is provided a method of manufacturing an integrated circuit device, the method including forming a fin type active area protruding from a substrate and having an upper surface at a first level and a nanosheet being located at a second level spaced apart from the upper surface of the fin type active area and extending in parallel to the upper surface of the fin type active area; forming a first insulating spacer on the nanosheet, the first insulating spacer defining a gate space; forming a second insulating spacer in a space between the upper surface of the fin type active are and the nanosheet, the second insulating spacer having a multilayer structure; forming a source and drain region on the fin type active area, the source and drain region being connected to one end of the nanosheet and one end of the second insulating layer; and forming a gate on the fin type active area, wherein the gate extends in a direction crossing the fin type active area, surrounds at least a part of the nanosheet, and faces the source and drain region, and the second insulating spacer is between the gate and the source and drain region.

The forming of the second insulating spacer may include forming a first liner and a second liner sequentially covering a surface of the nanosheet. The first liner and the second liner may include different materials.

The forming of the second insulating spacer may include: forming a first liner covering a surface of the nanosheet; and forming a second liner on the first liner. The second liner may include a first portion contacting the first liner between the nanosheet and the fin type active area, and a second portion spaced apart from the first liner with an air space interposed between the first liner and the second liner, the air space being disposed between the nanosheet and the fin type active area.

The forming of the second insulating spacer may include: forming a first liner covering a surface of the nanosheet; forming a second liner on the first liner, wherein the second liner contacts the first liner between the nanosheet and the fin type active area; and forming a burial liner on the second liner. The burial liner may contact the second liner between the nanosheet and the fin type active area. The first liner, the second liner, and the burial liner may include different materials from each other.

A portion of the second insulating spacer contacting the source and drain region may include a material different from a material of the first insulating spacer.

According to another aspect of the inventive concept, there is provided a method of manufacturing an integrated circuit device, the method including forming a fin type active area and a nanosheet stack structure including a plurality of nanosheets, wherein the fin type active area protrudes from a substrate and extends in a first direction, and the nanosheet stack structure faces an upper surface of the fin type active area, and is spaced apart from the upper surface; forming a first insulating spacer on the nanosheet stack structure, the first insulating spacer defining a gate space; forming a plurality of second insulating spacers, each having a multilayer structure, in spaces between the plurality of nanosheets and a space between the upper surface of the fin type active area and a lowest nanosheet among the plurality of nanosheets; forming a source and drain region on the fin type active area, the source and drain region being connected to one end of the nanosheet stack structure and ends of the plurality of second insulating spacers; and forming a gate on the fin type active area, wherein the gate extends in a second direction, surrounds the plurality of nanosheets, and faces the source and drain region, and the plurality of second insulating spacers is between the gate and the source and drain region.

The forming of the plurality of second insulating spacers may include forming an upper second insulating spacer in a space between the plurality of nanosheets and a lower second insulating spacer in a space between the upper surface of the fin type active area and the lowest nanosheet among the plurality of nanosheets. A thickness of the upper second insulating spacer may be greater than a thickness of the lower second insulating spacer.

The forming of the plurality of second insulating spacers may include forming insulating structures in spaces between the plurality of nanosheets and a space between the upper surface of the fin type active area and the lowest nanosheet among the plurality of nanosheets, each of the insulating structures including an air space.

The insulating structures may include two insulating liners including different materials and the air space interposed between the two insulating liners.

The insulating structures may include three insulating liners including different materials from each other.

According to another aspect of the inventive concept, an integrated circuit device comprises a substrate, a fin type active area that protrudes from the substrate, a plurality of source and drain regions on the fin type active area, a plurality of nanosheets that are adjacent to the plurality of source and drain regions, the plurality of source and drain regions being respectively connected to opposing ends of the plurality of nanosheets, and a plurality of insulating spacers disposed between ones of the plurality of nanosheets, each of the insulating spacers having a multi-layer structure.

The multi-layer structure may comprise at least one of an air space, SiN, SiCN, SiBN, SiON, SiOCN, SiBCN, SiOC, and $SiO_2$.

The integrated circuit device may further comprise a gate comprising a main gate portion and a plurality of sub-gate portions. The main gate portion is on the plurality of nanosheets and the plurality of sub-gate portions is between the fin type active area and the plurality of nanosheets.

The plurality of insulating spacers may be a plurality of nanosheet insulating spacers and the integrated circuit device may further comprise: insulating liners on sidewalls of the main gate portion, gate insulating spacers on sidewalls on the insulating liners, and protection layers on the insulating liners. The gate insulating spacers and the nanosheet insulating spacers comprise different materials.

The multi-layer structure may comprise a first liner, a second liner, and an air space. The first liner is disposed between a respective one of the plurality of sub-gate portions, and the second liner and the air space is at least partially limited by the second liner. The first liner and the second liner comprise different materials.

The first liner may not comprise oxygen and the second liner may have an oxygen content from about 0 to about 50 atom %.

The multi-layer structure may comprise a first liner, a second liner, and a burial layer. The first liner is disposed between a respective one of the plurality of sub-gate portions, and the second liner and the burial layer fills a space at least partially limited by the second liner. The first liner, the second liner, and the burial layer may comprise different materials.

The first liner may not comprise oxygen and the second liner and the burial layer each may have an oxygen content from about 0 to about 50 atom %.

The multi-layer structure may comprise a first liner, a second liner, an air space and a partial burial layer. The first liner is disposed between a respective one of the plurality of sub-gate portions, and the second liner and the air space is at least partially limited by the second liner and the partial burial layer. The first liner, the second liner, and the partial burial layer comprise different materials.

The first liner may not comprise oxygen and the second liner and the partial burial layer may each have an oxygen content from about 0 to about 50 atom %.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are explained in detail in the specification set forth below.

BRIEF DESCRIPTION OF THE DRAWINGS

Embodiments of the inventive concept will be more clearly understood from the following detailed description taken in conjunction with the accompanying drawings in which:

FIGS. 1A through 1C are diagrams illustrating an integrated circuit device according to embodiments of the inventive concept, wherein FIG. 1A is a plan layout diagram of main elements of the integrated circuit device, FIG. 1B is a cross-sectional view of the integrated circuit device taken along a line X-X' of FIG. 1A, and FIG. 1C is a cross-sectional view of the integrated circuit device taken along a line Y-Y' of FIG. 1A;

FIGS. 5 through 26 are cross-sectional views illustrating a method of manufacturing an integrated circuit device based on a process order, according to embodiments of the inventive concept, wherein FIGS. 5, 6A, 7A, 8A, 9A, 10A, 11A, 12 through 14, 15A, 16A and 17 through 26 are cross-sectional views of portions corresponding to cross-sections taken along the line X-X' of FIG. 1A, and FIGS. 6B, 7B, 8B, 9B, 10B, and 11B are cross-sectional views of portions corresponding to cross-sections taken along the line Y-Y' of FIG. 1A;

DETAILED DESCRIPTION OF THE EMBODIMENTS

Figure 1A:
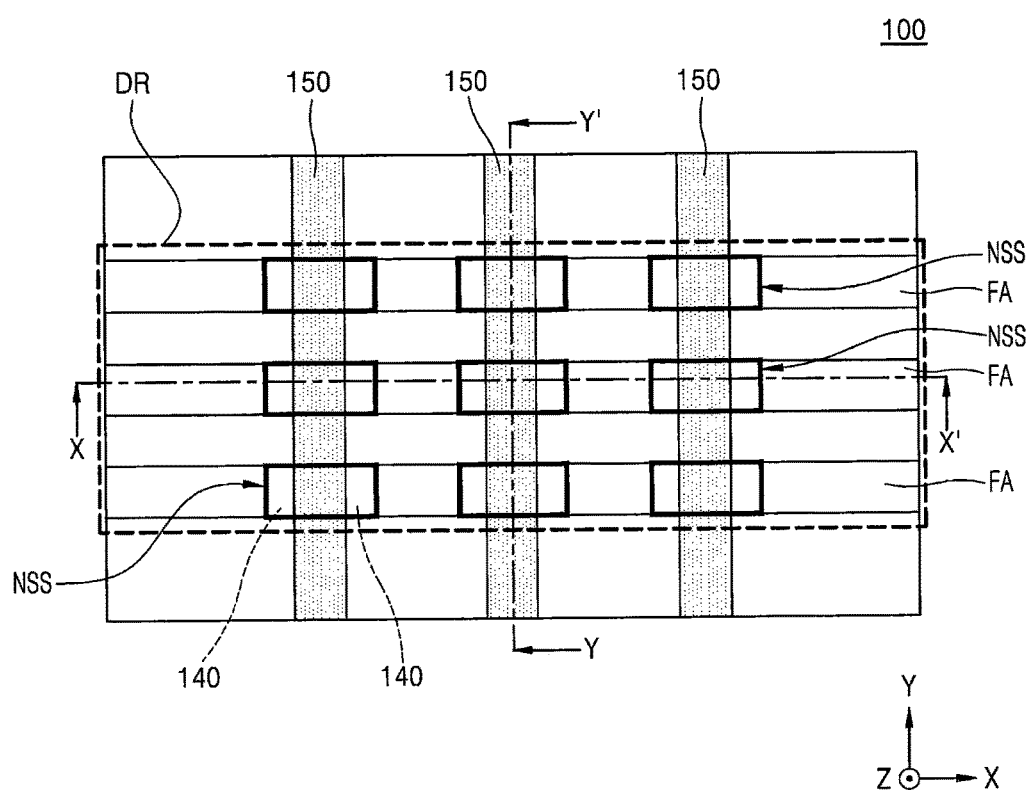

Hereinafter, the inventive concept will be described in detail by explaining embodiments of the invention with reference to the attached drawings. Like reference numerals in the drawings denote like elements, and, thus, their description will be omitted. As used herein, the term "and/or" includes any and all combinations of one or more of the associated listed items. Expressions such as "at least one of," when preceding a list of elements, modify the entire list of elements and do not modify the individual elements of the list.

The inventive concept may be embodied in many different forms and should not be construed as limited to the embodiments set forth herein. Rather, these embodiments are provided so that this disclosure will be thorough and complete, and will fully convey the scope of the inventive concept to those skilled in the art. In the drawings, lengths and sizes of layers and areas may be exaggerated for clarity.

As used herein, the singular terms "a," "an" and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Additionally, the embodiments in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Furthermore, throughout this disclosure, directional terms such as "upper," "intermediate," "lower," and the like may be used herein to describe the relationship of one element or feature with another, and the inventive concept should not be limited by these terms. Accordingly, these terms such as "upper," "intermediate," "lower," and the like may be replaced by other terms such as "first," "second," "third," and the like to describe the elements and features.

Also, though terms like 'first' and 'second' are used to describe various elements, components, areas, layers, and/or portions in various embodiments of the inventive concept, the elements, components, areas, layers, and/or portions should not be limited by these terms. These terms are only used to distinguish one element, component, area, layer, or portion from another. Thus, a first element, component, area, layer or section discussed below could be termed a second element, component, area, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits. Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

When a certain embodiment can be embodied in a different manner, a specified process order may be performed in a different manner in order to be described. For example, two processes to be described sequentially may be substantially performed at the same time or may be performed in an order opposite to the order to be described.

As such, variations from the shapes of the illustrations as a result, for example, of manufacturing techniques and/or tolerances, are to be expected. Thus, embodiments of the inventive concept should not be construed as limited to the particular shapes of areas illustrated herein but are to include deviations in shapes that result, for example, from manufacturing. A term such as "substrate" may denote a substrate itself, or a stack structure including a substrate and predetermined layers or films formed on a surface of the substrate. In addition, a term "surface of substrate" may denote an exposed surface of the substrate itself, or an external surface of a predetermined layer or a film formed on the substrate. In the present specification, a term "nanosheet" may denote a two-dimensional structure having a thickness from about 1 to about 100 nm.

Figure 1B:
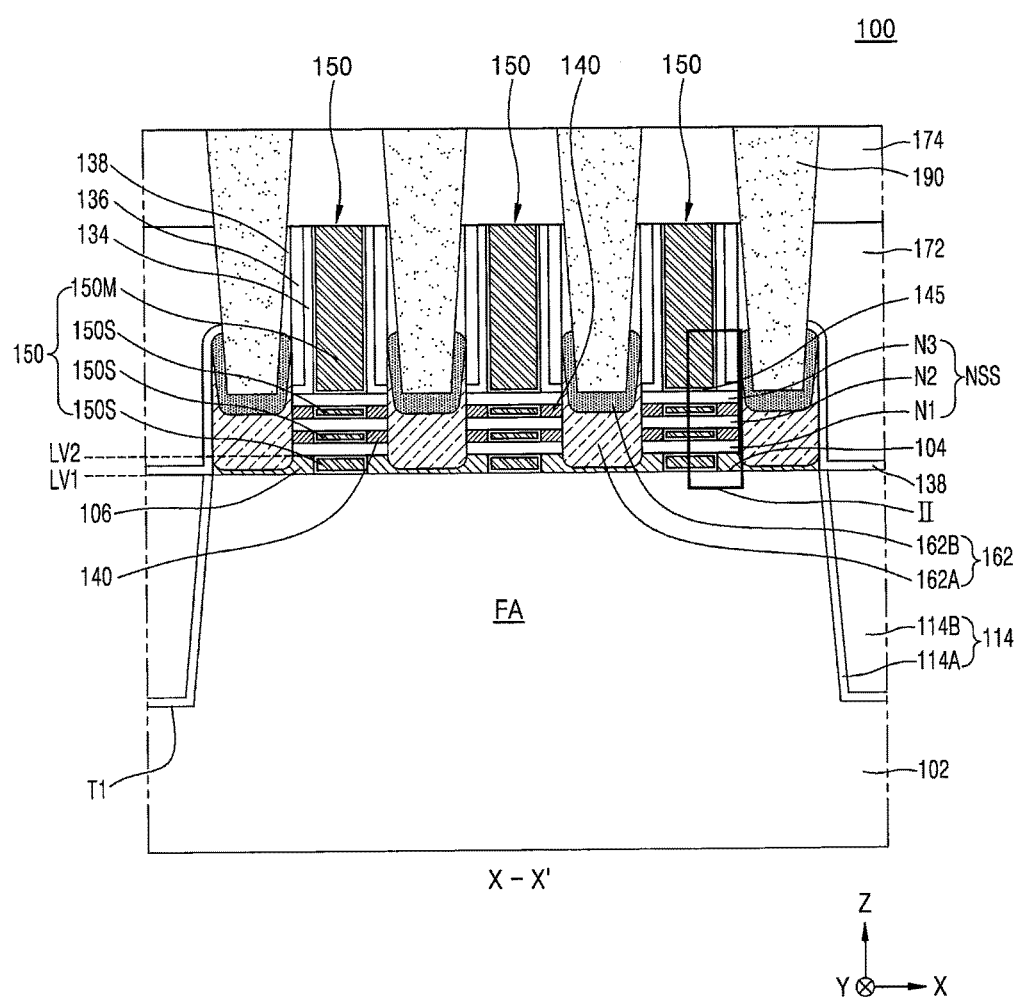
Figure 1C:
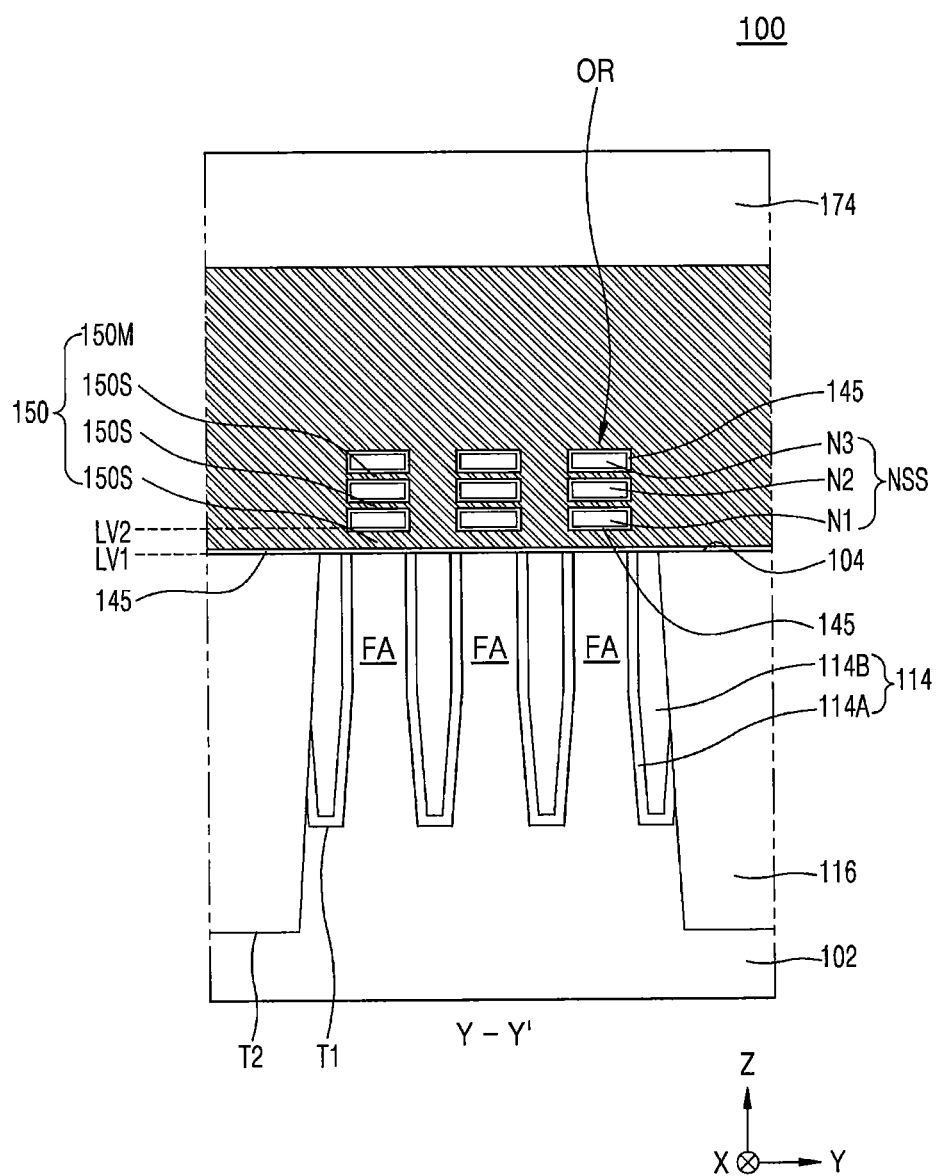

FIGS. 1A through 1C are diagrams illustrating an integrated circuit device 100 according to embodiments of the inventive concept, wherein FIG. 1A is a plan layout diagram of main elements of the integrated circuit device 100, FIG. 1B is a cross-sectional view of the integrated circuit device 100 taken along a line X-X' of FIG. 1A, and FIG. 1C is a cross-sectional view of the integrated circuit device 100 taken along a line Y-Y' of FIG. 1A.

Referring to FIGS. 1A through 1C, the integrated circuit device 100 may include a plurality of fin type active areas FA protruding from a substrate 102 and extending in a first direction (X direction) and a plurality of nanosheet stack structures NSS spaced apart from the upper surface 104 of the plurality of fin type active areas FA and facing an upper surface 104 of the plurality of fin type active areas FA.

A first trench T1 defining the plurality of fin type active areas FA and a second trench T2 defining a device area DR may be formed in the substrate 102. The second trench T2 may be deeper than the first trench T1.

Lower side walls of the plurality of fin type active areas FA may be covered by a shallow trench isolation (STI) layer 114 filling the first trench T1. The STI layer 114 may include an insulating liner 114A conformally covering an inner wall of the first trench T1 and a gap-fill insulating layer 114B filling the first trench T1 on the insulating liner 114A. The second trench T2 may be filled with a device isolation layer 116. A level of the upper surface 104 of the plurality of fin type active areas FA, a level of an upper surface of the STI layer 114, and a level of an upper surface of the device isolation layer 132 may be the same as or similar to each other.

A plurality of gates 150 may extend in a second direction (Y direction) crossing the first direction on the plurality of fin type active areas FA. The upper surface 104 of the plurality of fin type active areas FA may have a first level LV1.

The plurality of nanosheet stack structures NSS may be spaced apart from the upper surface 104 of the plurality of fin type active areas FA. The plurality of nanosheet stack structures NSS may include a plurality of nanosheets N1, N2, and N3 extending in parallel to the upper surface 104 of the plurality of fin type active areas FA at a second level LV2 farther than the first level LV1 from the substrate 102. The present example describes the configuration in which the plurality of nanosheet stack structures NSS and the plurality of gates 150 are formed on the single fin type active area FA, and the plurality of nanosheet stack structures NSS are arranged on the single fin type active area FA in a line along an extending direction (X direction) of the fin type active area FA but the inventive concept is not limited thereto. The number of the nanosheet stack structures NSS arranged on the single fin type active area FA is not be particularly limited. For example, the single nanosheet stack structure NSS may be formed on the single fin type active area FA.

The plurality of nanosheets N1, N2, and N3 constituting the plurality of nanosheet stack structures NSS may be sequentially stacked on the upper surface 104 of the plurality of fin type active areas FA one by one. The present example describes a case where the single nanosheet stack structure NSS includes the three nanosheets N1, N2, and N3, but the inventive concept is not limited thereto. For example, each of the three nanosheets N1, N2, and N3 may include one nanosheet, and may include a plurality of nanosheets that are variously selected if necessary. Each of the plurality of nanosheets N1, N2, and N3 may include a channel area.

The plurality of gates 150 may be formed to surround at least some of the plurality of nanosheets N1, N2, and N3 while covering the nanosheet stack structures NSS. Each of the plurality of gates 150 may include a main gate portion 150M covering an upper surface of the nanosheet stack structures NSS and a plurality of sub-gate portions 150S formed in a space between the fin type active areas FA and the nanosheets N1, N2, and N3. A thickness of each of the plurality of sub-gate portions 150S may be smaller than a thickness of the main gate portion 150M. In this regard, the thicknesses of the plurality of sub-gate portions 150S and the thickness of the main gate portion 150M refer to thicknesses in a Z direction in FIGS. 1A through 1C.

A gate dielectric layer 145 may be formed between the nanosheet stack structures NSS and the gates 150.

The plurality of nanosheets N1, N2, and N3 may be formed in an overlap region OR covered by the gates 150 in spaces between the fin type active areas FA and the gates 150. In an X-Y plane, the nanosheet stack structures NSS including the plurality of nanosheets N1, N2, and N3 may have a larger plane area than a plane area of the overlap region OR. FIG. 1A shows a case where plane shapes of the nanosheet stack structures NSS are approximately rectangular shapes, but the inventive concept is not limited thereto. The nanosheet stack structures NSS may have various plane shapes according to plane shapes of the fin type active areas FA and plane shapes of the gates 150.

The substrate 102 may include semiconductors, such as Si and Ge, or compound semiconductors, such as SiGe, SiC, GaAs, InAs, and InP. In some embodiments, the substrate 102 may include at least one of a group III-V material and a group IV material. The group III-V material may include a binary, a trinary, or a quaternary compound including at least one group III element and at least one group V element. The group III-V material may be a compound including at least one element of In, Ga, and Al as the group III element and at least one element of As, P, and Sb as the group V element. For example, the group III-V material may be selected from InP, $In_zGa_{1-z}As$ ($0 \leq z \leq 1$), and $Al_zGa_{1-z}As$ ($0 \leq z \leq 1$). The binary compound may be one of, for example, InP, GaAs, InAs, InSb and GaSb. The trinary compound may be one of InGaP, InGaAs, AlInAs, InGaSb, GaAsSb and GaAsP. The group IV material may be Si or Ge. However, the embodiments of the inventive concept are not limited to the above examples of the group III-V material and the group IV material. The group III-V material and the group IV material, such as Ge, may be used as channel materials for forming a transistor having a low power consumption and a high operating speed. A high performance complementary metal oxide semiconductor (CMOS) may be fabricated by using a semiconductor substrate including the group III-V material, e.g., GaAs, having a higher electron mobility than that of an Si substrate, and a semiconductor substrate having a semiconductor material, e.g., Ge, having a higher hole mobility than that of the Si substrate. In some embodiments, when an NMOS transistor is formed on the substrate 102, the substrate 102 may include one of the group III-V materials described above. In some other embodiments, when a PMOS transistor is formed on the substrate 102, at least a part of the substrate 102 may include Ge. In other embodiments, the substrate 102 may have a silicon-on-insulator (SOI) structure. The substrate 102 may include a conductive area, for example, a well doped with impurities or a structure doped with impurities.

In some embodiments, the plurality of nanosheets N1, N2, and N3 may include a single material. In some embodiments, the plurality of nanosheets N1, N2, and N3 may be formed of the same material as that of the substrate 102.

The insulating liner 114A covering the inner wall of the first trench T1 may include an oxide layer, SiN (silicon nitride), SiON (silicon oxynitride), SiBN (silicon boronitride), SiC (silicon carbide), SiC:H, SiCN, SiCN:H, SiOCN, SiOCN:H, SiOC (silicon oxycarbide), $SiO_2$ (silicon dioxide), polysilicon, or a combination thereof. In some embodiments, the insulating liner 114A may have a thickness ranging from about 10 Å to about 100 Å.

In some embodiments, the gap-fill insulating layer 114B may include an oxide layer. In some embodiments, the gap-fill insulating layer 114B may include an oxide layer formed through a deposition process or a coating process. In some embodiments, the gap-fill insulting layer 114B may include an oxide layer formed through a flowable chemical vapour deposition (FCVD) process or a spin coating process. For example, the gap-fill insulting layer 114B may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ), but is not limited thereto.

The device isolation layer 116 filled in the second trench T2 may include an oxide layer, a nitride layer, or a combination thereof. In some embodiments, the device isolation layer 116 and the gap-fill insulting layer 114B may include the same material.

The gate dielectric layer 145 may have a stack structure of an interfacial layer and a high dielectric layer. The interfacial layer may cure an interface defect between the upper surface 104 of the plurality of fin type active areas FA and surfaces of the plurality of nanosheets N1, N2, and N3 and the high dielectric layer. In some embodiments, the interfacial layer may include a low dielectric material layer having a dielectric constant of 9 or less, e.g., a silicon oxide layer, a silicon oxynitride layer, or a combination thereof. In some other embodiments, the interfacial layer may include silicate, a combination of the silicate and a silicon oxide layer, or a combination of the silicate and a silicon oxynitride layer. In some embodiments, the interfacial layer may be omitted. The high dielectric layer may include a material having a dielectric constant greater than that of the silicon oxide layer. For example, the high dielectric layer may have a dielectric constant of about 10 to about 25. The high dielectric layer may include a material selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but is not limited thereto. The high dielectric layer may be formed by an atomic layer deposition (ALD), a chemical vapour deposition (CVD), or physical vapor deposition (PVD) process. The high dielectric layer may have a thickness ranging from about 10 Å to about 40 Å, but is not limited thereto.

The gates 150 may include a layer containing metal for adjusting a work function, and a layer containing metal for filling a gap formed on an upper portion of the layer containing metal for adjusting the work function. In some embodiments, the gates 150 may have a structure in which a metal nitride layer, a metal layer, a conductive capping layer, and a gap-fill metal layer are sequentially stacked. The metal nitride layer and the metal layer may each include at least one metal material selected from Ti, W, Ru, Nb, Mo, Hf, Ni, Co, Pt, Yb, Tb, Dy, Er, and Pd. The metal nitride layer and the metal layer may be formed by an ALD process, a metal organic ALD (MOALD) process, or a metal organic CVD (MOCVD) process. The conductive capping layer may act as a protective layer for preventing or reducing oxidation of a surface of the metal layer. In addition, the conductive capping layer may act as a wetting layer for making a deposition of another conductive layer on the metal layer easy. The conductive capping layer may include a metal nitride layer, e.g., TiN, TaN, or a combination thereof, but is not limited thereto. The gap-fill metal layer may extend on the conductive capping layer. The gap-fill metal layer may include a W layer. The gap-fill metal layer may be formed by the ALD, the CVD, or the PVD process. The gap-fill metal layer may embed a recess space formed by a step between areas on an upper surface of the conductive capping layer without a void. In some embodiments, the gates 150 may include a stack structure of TiAlC/TiN/W, a stack structure of TiN/TaN/TiAlC/TiN/W, or a stack structure of TiN/TaN/TiN/TiAlC/TiN/W. In the above stack structures, a TiAlC layer or a TiN layer may function as a layer containing metal for adjusting the work function.

A plurality of source and drain regions 162 may be formed on the fin-type active areas FA. The plurality of source and drain regions 162 may be respectively connected to ends of the plurality of nanosheets N1, N2, and N3 that are adjacent to the plurality of source and drain regions 162.

The plurality of source and drain regions 162 may include a semiconductor layer 162A that is epitaxially grown from the plurality of nanosheets N1, N2, and N3. The source and drain regions 162 may have an embedded SiGe structure including a Si layer that is epitaxially grown, an SiC layer that is epitaxially grown, and a plurality of SiGe layers that are epitaxially grown. The plurality of source and drain regions 162 may further include a metal silicide layer 162B formed on the semiconductor layer 162A. In some embodiments, the metal silicide layer 162B may include titanium silicide, but is not limited thereto. In some embodiments, the metal silicide layer 162B may be omitted.

Insulating liners 134, first insulating spacers 136, and protection layers 138 that sequentially cover sidewalls of the gates 150 may be formed on the plurality of nanosheet stack structures NSS. The protection layers 138 may extend to cover the plurality of source and drain regions 162. The insulating liners 134, the first insulating spacers 136, and the protection layers 138 may include silicon nitride layers but are not limited thereto. In some embodiments, the protection layers 138 may be omitted.

The insulating liners 134, the first insulating spacers 136, and the protection layers 138 may cover a sidewall of the main gate portion 150M included in the gates 150.

Second insulating spacers 140 contacting the source and drain regions 162 may be formed in spaces between the plurality of nanosheets N1, N2, and N3. The second insulating spacers 140 may be disposed between the sub-gate portions 150S and the source and drain regions 162 in the spaces between the plurality of nanosheets N1, N2, and N3. The second insulating spacers 140 may cover sidewalls of at least some of the plurality of sub-gate portions 150S. In the integrated circuit device 100 illustrated in FIG. 1B, both side walls of the two sub-gate portions 150S, excluding the sub-gate portion 150S closest to the fin type active areas FA, among the three sub-gate portions 150S may be covered by the second insulating spacers 140. As illustrated in FIG. 1B, both side walls of the sub-gate portion 150S closest to the fin type active areas FA among the three sub-gate portions 150S may be covered by a buffer semiconductor layer 106 covering the upper surface 104 of the fin type active areas FA. The buffer semiconductor layer 106 may include a material different from materials of the fin type active areas FA and the plurality of nanosheets N1, N2, and N3. For example, the fin type active areas FA may include Si, and the buffer semiconductor layer 106 may include Ge.

The first insulating layers 136 and the second insulating spacer 140 may include different materials. In some embodiments, the first insulating spacers 136 may include a silicon nitride layer, and the second insulating spacers 140 may include a silicon nitride layer further including an oxygen (O) atom, boron (B) atom, a carbon (C) atom, or atoms including a combination thereof. In some other embodiments, the first insulating spacers 136 may include an insulating layer in which seeding and epitaxial growth of a semiconductor atom are impossible on its surface, and the second insulating spacers 140 may include an insulating layer in which seeding and epitaxial growth of a semiconductor atom are possible on at least a part of its surface. For example, the first insulating spacer 136 may include a SiN layer, and the second insulating spacers 140 may include a SiON layer. The SiON layer may be formed in contact with the semiconductor layer 162A of the source and drain regions 162.

In some embodiments, at least some of the plurality of second insulating spacers 140 may include an air space.

The plurality of second insulating spacers 140 may have a multilayer structure. In some embodiments, the plurality of second insulating spacers 140 may include at least one insulator selected from an air space, SiN, SiCN, SiBN, SiON, SiOCN, SiBCN, SiOC, and $SiO_2$. For example, the plurality of second insulating spacers 140 may have at least a triple layer structure. A part of the at least a triple layer structure may be the air space.

Figure 2A:
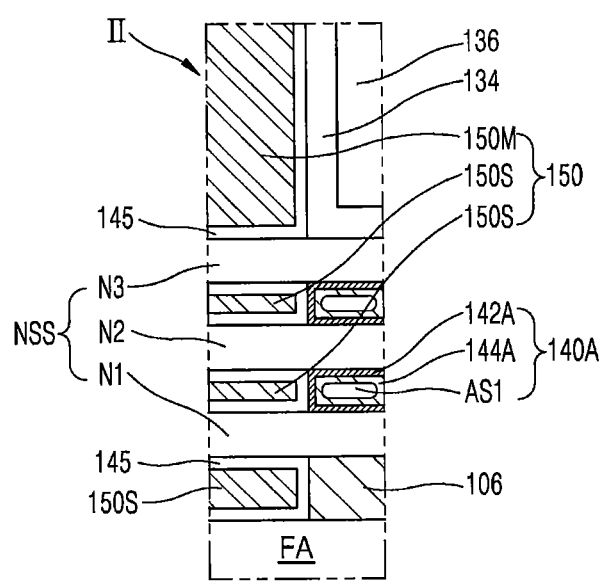
FIGS. 2A through 2C are cross-sectional views of configurations of second insulating spacers of various multi-layer structures that may be used in an integrated circuit device according to embodiments of the inventive concept.
Figure 2B:
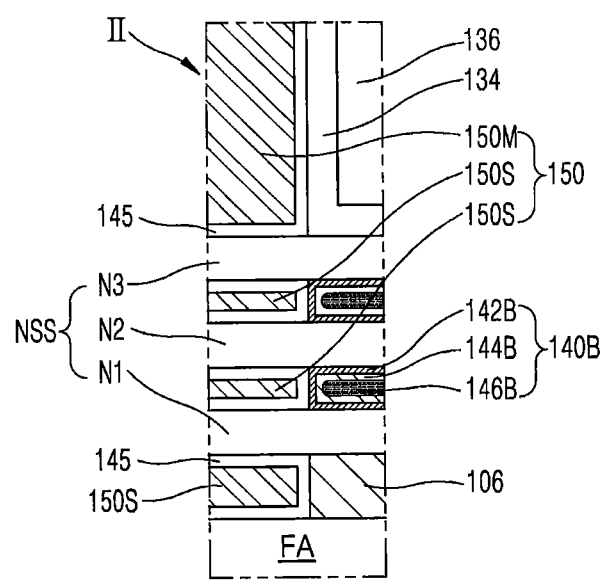
Figure 2C:
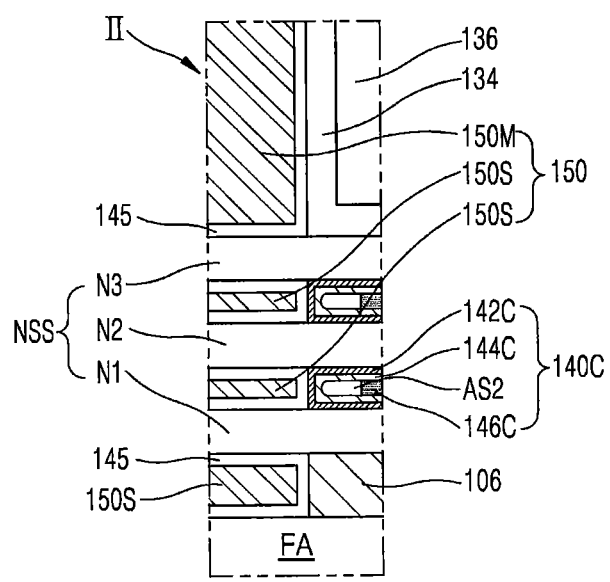

FIGS. 2A through 2C are cross-sectional views of configurations of second insulating spacers 140A, 140B, and 140C of various multilayer structures that may be used as the second insulating spacers 140 of the integrated circuit device 100 according to embodiments of the inventive concept, by expanding a portion corresponding to an area II in FIG. 1B.

As shown in FIG. 2A, the second insulating spacer 140A may include a first liner 142A, a second liner 144A, and an air space AS1.

The first liner 142A may have a surface facing the sub-gate portion 150S of the gate 150 and a surface facing at least one of a plurality of nanowires N1, N2, and N3, and may include a first insulating material that does not include oxygen.

The second liner 144A may be spaced apart from the sub-gate portion 150S and the nanowires N1, N2, and N3 with the first liner 142A interposed therebetween and may include a second insulating material different from the first insulating material.

The air space AS1 may be partially limited by the second liner 144A.

In some embodiments, the first liner 142A may include one of SiN, SiCN, and SiBN, and the second liner 144A may include one of SiON, SiOCN, and SiBCN.

In some embodiments, the first insulating material constituting the first liner 142A may not include oxygen, and the second insulating material constituting the second liner 144A may have oxygen content ranging from about 0 to about 50 atom %.

As shown in FIG. 2B, the second insulating spacer 140B may include a first liner 142B, a second liner 144B, and a burial layer 146B.

The first liner 142B may have a surface facing the sub-gate portion 150S of the gate 150 and a surface facing at least one of the plurality of nanowires N1, N2, and N3, and may include the first insulating material that does not include oxygen.

The second liner 144B may be spaced apart from the sub-gate portion 150S and the nanowires N1, N2, and N3 with the first liner 142B interposed therebetween and may include the second insulating material different from the first insulating material.

The burial layer 146B may fill at least a part of a space limited by the second liner 142B and may include a third insulating material different from the second insulating material.

In some embodiments, the first liner 142B may include one of SiN, SiCN, and SiBN, and the second liner 144B and the burial layer 146B may include different materials selected from SiON, SiOCN, and SiBCN.

In some embodiments, the first insulating material constituting the first liner 142B may not include oxygen, and the second and third insulating materials respectively constituting the second liner 144B and the burial layer 146B may have oxygen content ranging from about 0 to about 50 atom %.

As shown in FIG. 2C, the second insulating spacer 140C may include a first liner 142C, a second liner 144C, an air space AS2, and a partial burial layer 146C.

The first liner 142C may have a surface facing the sub-gate portion 150S of the gate 150 and a surface facing at least one of the plurality of nanowires N1, N2, and N3, and may include the first insulating material that does not include oxygen.

The second liner 144C may be spaced apart from the sub-gate portion 150S and the nanowires N1, N2, and N3 with the first liner 142C interposed therebetween and may include the second insulating material different from the first insulating material.

The air space AS2 may be partially limited by the second liner 144C.

The partial burial layer 146C along with the second liner 144C may limit the air space AS2.

In some embodiments, the first liner 142C may include one of SiN, SiCN, and SiBN, and the second liner 144C and the partial burial layer 146C may include different materials selected from SiON, SiOCN, and SiBCN.

In some embodiments, the first insulating material constituting the first liner 142C may not include oxygen, and materials constituting the second liner 144C and the partial burial layer 146C may have oxygen content ranging from about 0 to about 50 atom %.

Referring to FIGS. 1A through 1C, an inter-gate insulating layer 172 and an interlayer insulating layer 174 may be sequentially formed on the plurality of source/drain regions 162. The inter-gate insulating layer 172 and an interlayer insulating layer 174 may include a silicon nitride layer, but are not limited thereto.

A contact plug 190 may be connected to each of the plurality of source and drain regions 162. The contact plug 190 may pass through the interlayer insulating layer 174, the inter-gate insulating layer 172, and the protection layer 138 and may be connected to the plurality of source and drain regions 162. The metal silicide layer 162B may be disposed between the semiconductor layer 162A and the contact plug 190. The contact plug 190 may include metal, conductive metal nitride, or a combination thereof. For example, the contact plug 190 may include W, Cu, Al, Ti, Ta, TiN, TaN, an alloy thereof, or a combination thereof, but is not limited thereto. Embodiments of the inventive concept are not limited to the above materials.

The integrated circuit device 100 described with reference to FIGS. 1A through 2C above may include the plurality of second insulating spacers 140 contacting the source and drain regions 162 in spaces between the plurality of nanosheets N1, N2, and N3 formed on the fin type active areas FA. The plurality of second insulting spacers 140 may be formed as a multilayer structure or may be formed to include air spaces, and, thus, capacitance between the sub-gate portions 150S of the gates 150 present in spaces between the plurality of nanosheets N1, N2, and N3 and the source and drain regions 162 may be reduced, thereby reducing effective switching capacitance Ceff.

Figure 3:
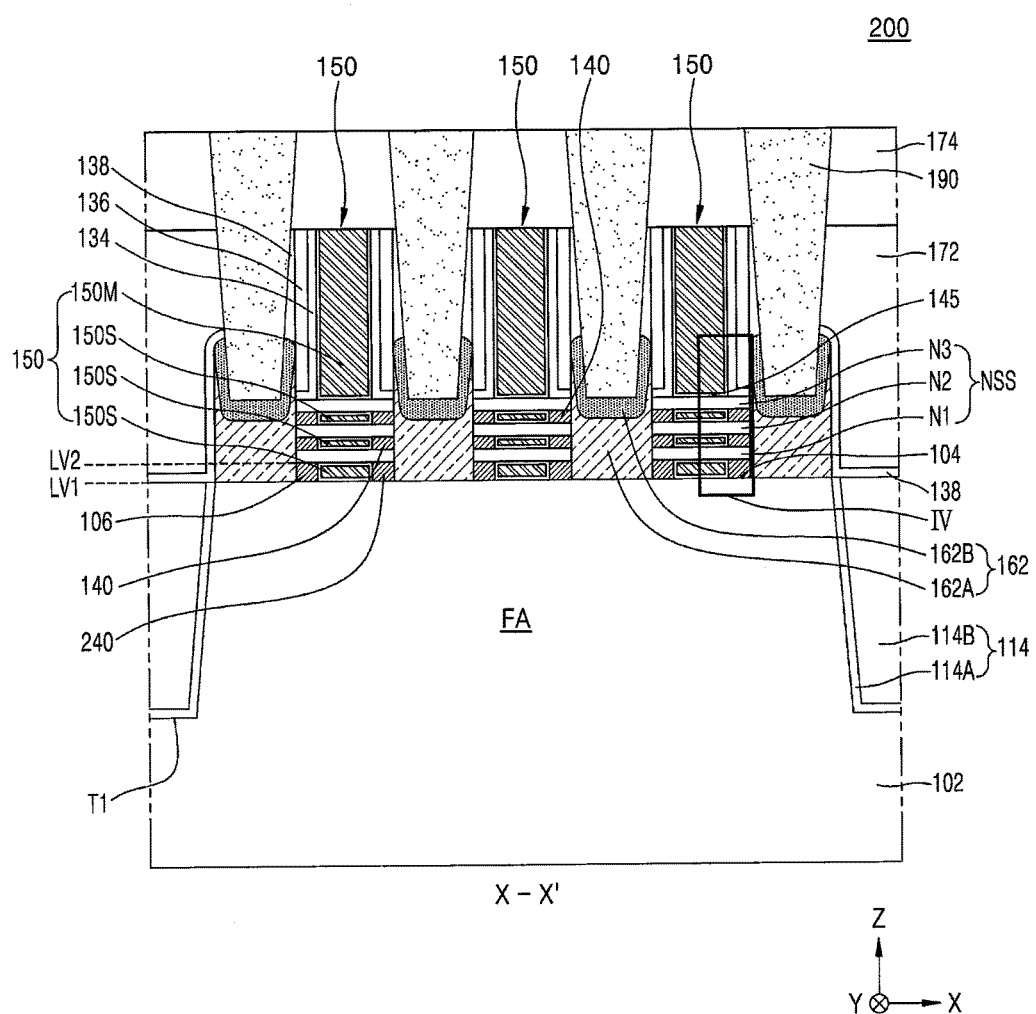
FIG. 3 is a cross-sectional view of an integrated circuit device according to other embodiments of the inventive concept.

FIG. 3 is a cross-sectional view of an integrated circuit device 200 according to other embodiments of the inventive concept. The integrated circuit device 200 illustrated in FIG. 3 may have the same layout as shown in the plan layout diagram illustrated in FIG. 1A. FIG. 3 illustrates a cross-sectional view taken along line X-X' of FIG. 1A. In FIG. 3, the same reference numerals are used to denote the same elements as in FIGS. 1A through 2C, and detailed descriptions thereof are omitted.

The integrated circuit device 200 illustrated in FIG. 3 may generally have the same configuration as the integrated circuit device 100 illustrated in FIGS. 1A through 1C, except that the integrated circuit device 200 may not include the buffer semiconductor layer 106 illustrated in FIG. 1B. In the integrated circuit device 200, the sub-gate portions 150S may also be formed not only in spaces between the plurality of nanosheets N1, N2, and N3 but also in spaces between the fin type active areas FA and the nanosheet N1. The plurality of second insulating spacers 140 and a plurality of second insulating spacers 240 may include the plurality of second insulating spacers 140 formed in the spaces between the plurality of nanosheets N1, N2, and N3 and the second insulating spacers 240 formed in contact with the source and drain regions 162 in the spaces between the fin type active areas FA and the nanosheet N1. The second insulating spacers 140 and 240 may be disposed between the sub-gate portions 150S and the source and drain regions 162 in spaces between the upper surface 104 of the fin type active areas FA and the plurality of nanosheets N1, N2, and N3. The second insulating spacers 140 and 240 may cover side walls of the plurality of sub-gate portions 150S. A thickness of the second insulating spacer 240 that is the closest to the substrate 102 among the second insulating spacers 240 may be greater than a thickness of the other second insulating spacers 140. A more detailed configuration of the second insulating spacers 240 is generally the same as that of the second insulating spacers 140 described with reference to FIGS. 1A through 2C.

Figure 4A:
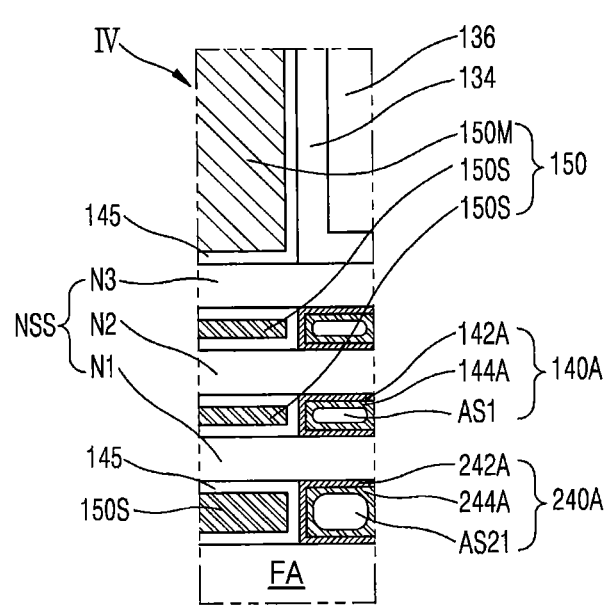
FIGS. 4A through 4C are cross-sectional views of configurations of second insulating spacers of various multi-layer structures that may be used in an integrated circuit device according to other embodiments of the inventive concept.
Figure 4B:
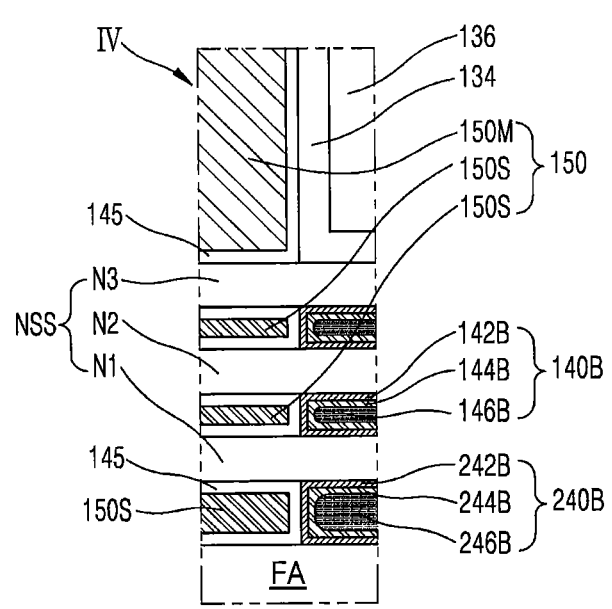
Figure 4C:
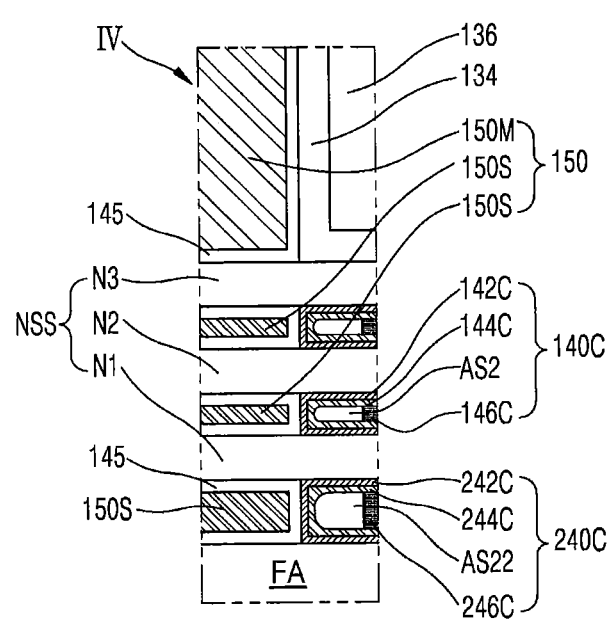

FIGS. 4A through 4C are cross-sectional views of configurations of second insulating spacers 140A, 140B, 140C, 240A, 240B, and 240C of various multilayer structures that may be used as the second insulating spacers 140 and 240 of the integrated circuit device 200 according to other embodiments, by expanding a portion corresponding to an area IV indicated in FIG. 3. In FIGS. 4A through 4C, the same reference numerals are used to denote the same elements as in FIGS. 1A through 3, and detailed descriptions thereof are omitted.

The second insulating spacer 240A of FIG. 4A may include a first liner 242A, a second liner 244A, and an air space AS21.

The first liner 242A may have a surface facing the sub-gate portion 150S that is the closest to the fin type active area FA among the plurality of sub-gate portions 150S of the gate 150, a surface facing the nanowire N1 that is the closest to the fin type active area FA among the plurality of nanowires N1, N2, and N3, and a surface facing the fin type active area FA, and may include a first insulating material that does not include oxygen.

The second liner 244A may be spaced apart from the fin type active area FA, the sub-gate portion 150S, and the nanowire N1 with the first liner 242A interposed therebetween and may include a second insulating material different from the first insulating material.

The air space AS21 may be partially limited by the second liner 244A.

More detailed descriptions of the first liner 242A and the second liner 244A are generally the same as described regarding the first liner 142A and the second liner 144A with reference to FIG. 2A.

The second insulating spacer 240B of FIG. 4B may include a first liner 242B, a second liner 244B, and a burial layer 246B.

The first liner 242B may have a surface facing the sub-gate portion 150S that is the closest to the fin type active area FA among the plurality of sub-gate portions 150S of the gate 150, a surface facing the nanowire N1 that is the closest to the fin type active area FA among the plurality of nanowires N1, N2, and N3, and a surface facing the fin type active area FA, and may include a first insulating material that does not include oxygen.

The second liner 244B may be spaced apart from the fin type active area FA, the sub-gate portion 150S, and the nanowire N1 with the first liner 242B interposed therebetween and may include the second insulating material different from the first insulating material.

The burial layer 246B may fill at least a part of a space limited by the second liner 242B and may include a third insulating material different from the second insulating material.

More detailed descriptions of the first liner 242B, the second liner 244B, and the burial layer 246B are generally the same as described regarding the first liner 142b, the second liner 144B, and the burial layer 146B with reference to FIG. 2B.

The second insulating spacer 240C of FIG. 4C may include a first liner 242C, a second liner 244C, an air space AS22, and a partial burial layer 246C.

The first liner 242C may have a surface facing the sub-gate portion 150S that is the closest to the fin type active area FA among the plurality of sub-gate portions 150S of the gate 150, a surface facing the nanowire N1 that is the closest to the fin type active area FA among the plurality of nanowires N1, N2, and N3, and a surface facing the fin type active area FA, and may include a first insulating material that does not include oxygen.

The second liner 244C may be spaced apart from the fin type active area FA, the sub-gate portion 150S, and the nanowire N1 with the first liner 242C interposed therebetween and may include the second insulating material different from the first insulating material.

The air space AS22 may be partially limited by the second liner 244C.

The partial burial layer 246C along with the second liner 244C may limit the air space AS22.

More detailed descriptions of the first liner 242C, the second liner 244c, the air space AS22, and the partial burial layer 246C are generally the same as described regarding the first liner 142C, the second liner 144C, the air space AS2, and the partial burial layer 146C with reference to FIG. 2C.

The integrated circuit device 200 described with reference to FIGS. 3 through 4C above may include the plurality of second insulating spacers 140 and 240 contacting the source and drain regions 162 in not only spaces between the plurality of nanosheets N1, N2, and N3 but also spaces between the fin type active areas FA and the nanosheet N1. The plurality of second insulting spacers 140 and 240 may be formed as a multilayer structure or some of the plurality of second insulting spacers 140 and 240 may be configured as air spaces, and, thus, capacitance between the sub-gate portions 150S of the gates 150 present in spaces between the fin type active areas FA and the plurality of nanosheets N1, N2, and N3 and the source and drain regions 162 may be reduced, thereby reducing effective switching capacitance Ceff.

FIGS. 5 through 26 are cross-sectional views illustrating a method of manufacturing the integrated circuit device 100 based on a process order, according to embodiments of the inventive concept. The method of manufacturing the integrated circuit device 100 illustrated in FIGS. 1A through 1C will be described with reference to FIGS. 5 through 26. In FIGS. 5 through 26, FIGS. 5, 6A, 7A, 8A, 9A, 10A, 11A, 12 through 14, 15A, 16A and 17 through 26 are cross-sectional views of portions corresponding to cross-sections taken along the line X-X' of FIG. 1A, and FIGS. 6B, 7B, 8B, 9B, 10B, and 11B are cross-sectional views of portions corresponding to cross-sections taken along the line Y-Y' of FIG. 1A. In FIGS. 5 through 26, the same reference numerals are used to denote the same elements as in FIGS. 1A through 2C, and detailed descriptions thereof are omitted.

Figure 5:
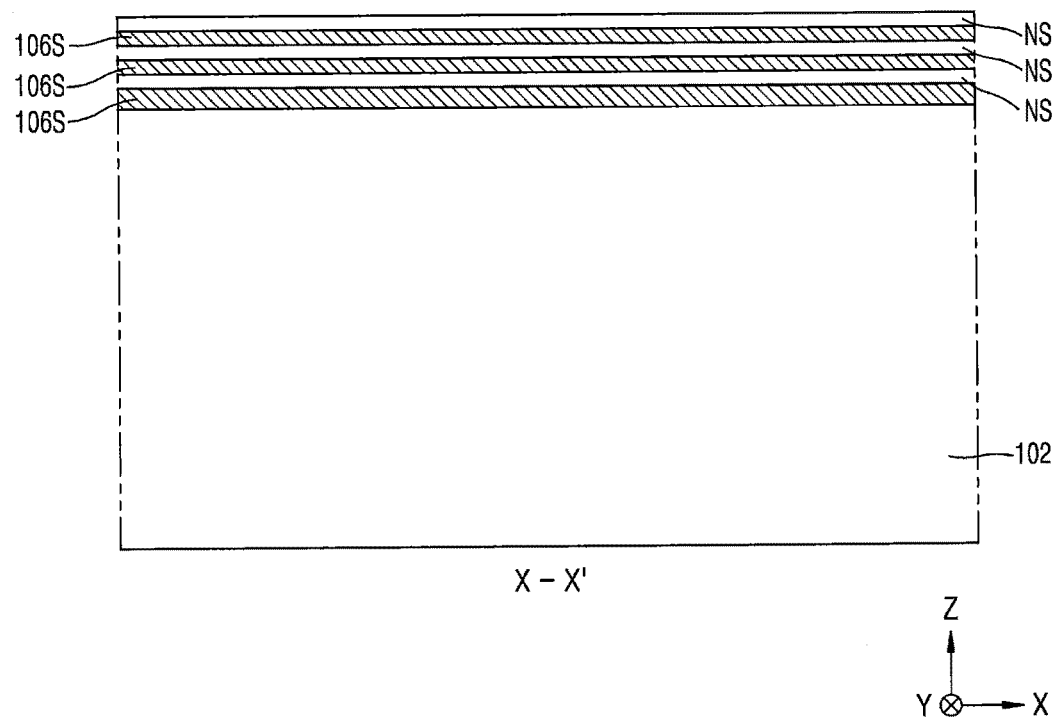

Referring to FIG. 5, a plurality of sacrifice semiconductor layers 106S and a plurality of nanosheet semiconductor layers NS may be alternately stacked on the substrate 102.

The plurality of sacrifice semiconductor layers 106S and the plurality of nanosheet semiconductor layers NS may include different semiconductor materials. In some embodiments, the plurality of sacrifice semiconductor layers 106S may include SiGe, and the plurality of nanosheet semiconductor layers NS may include Si, but embodiments of the inventive concept are not limited thereto.

A thickness of the sacrifice semiconductor layer 106S that is the closest to the substrate 102 among the plurality of sacrifice semiconductor layers 106S may be greater than those of the other sacrifice semiconductor layers 106S, but is not limited thereto. For example, the sacrifice semiconductor layers 106S may have the same thickness.

Figure 6A:
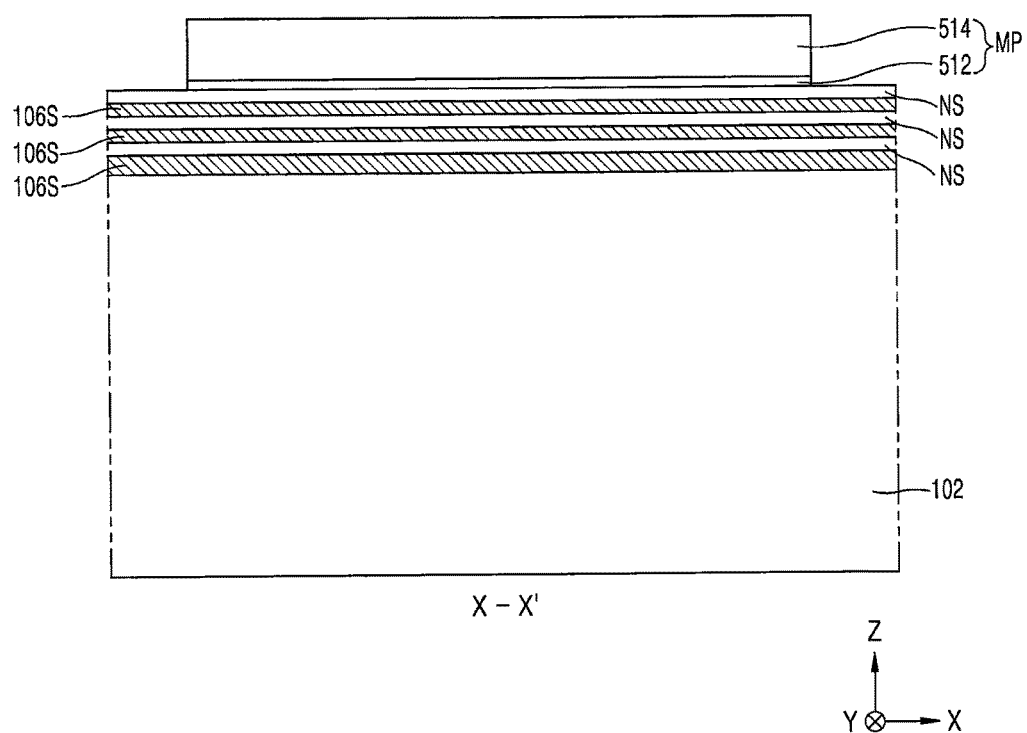
Figure 6B:
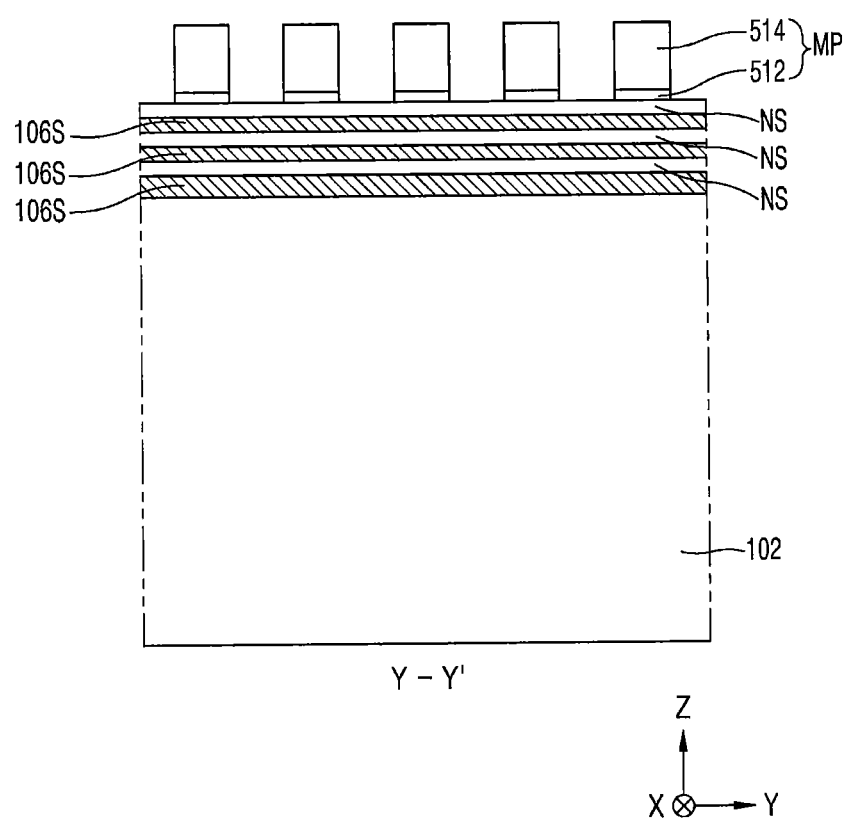

Referring to FIGS. 6A and 6B, a mask pattern MP may be formed on a stack structure of the plurality of sacrifice semiconductor layers 106S and the plurality of nanosheet semiconductor layers NS.

The mask pattern MP may include a plurality of line patterns extending in parallel to each other in one direction (X direction).

The mask pattern MP may include a pad oxide layer pattern 512 and a hard mask pattern 514. The hard mask pattern 512 may include silicon nitride, polysilicon, a spin-on hardmask (SOH) material, or a combination thereof, but is not limited thereto. In some embodiments, the SOH material may include a hydrocarbon compound having a relatively high carbon content ranging from about 85 w % to about 99 w % in relation to the total weight of the SOH material or derivatives thereof.

Figure 7A:
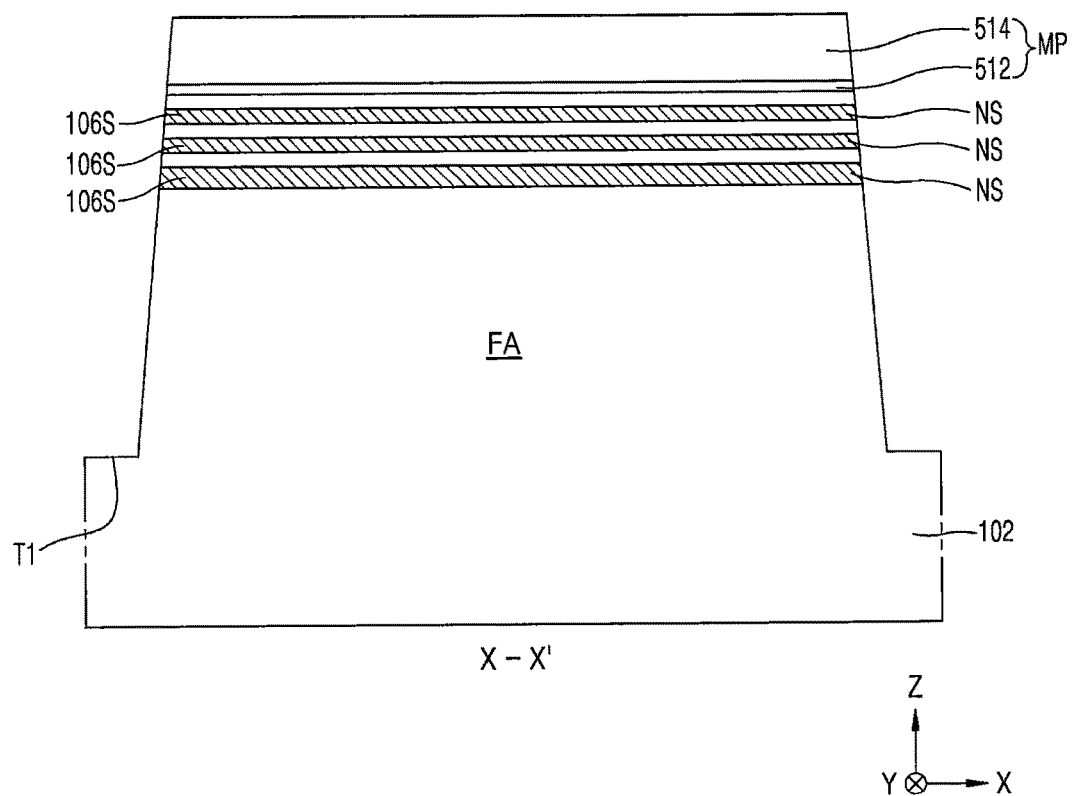
Figure 7B:
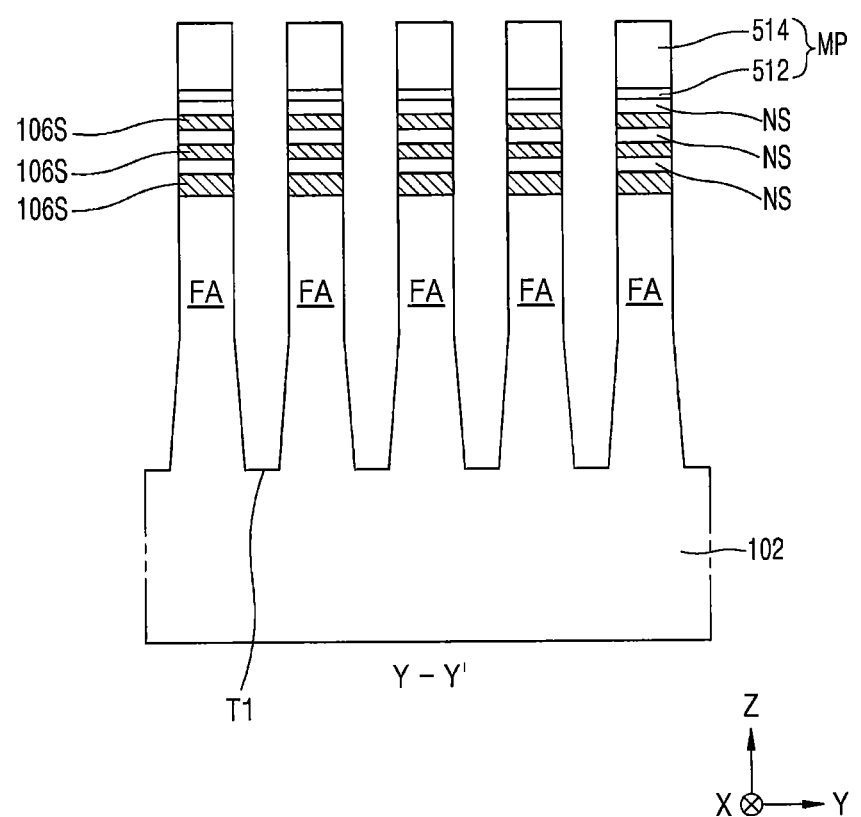

Referring to FIGS. 7A and 7B, the stack structure of the sacrifice semiconductor layers 106S and the plurality of nanosheet semiconductor layers NS may be formed by using the mask pattern MP as an etch mask and the plurality of first trenches T1 may be formed by etching a part of the substrate 102. As a result, the plurality of fin type active areas FA defined by the plurality of first trenches T1 may be formed.

After the plurality of fin type active areas FA is formed, the stack structure of the sacrifice semiconductor layers 106S and the plurality of nanosheet semiconductor layers NS may remain on the plurality of fin type active areas FA.

Figure 8A:
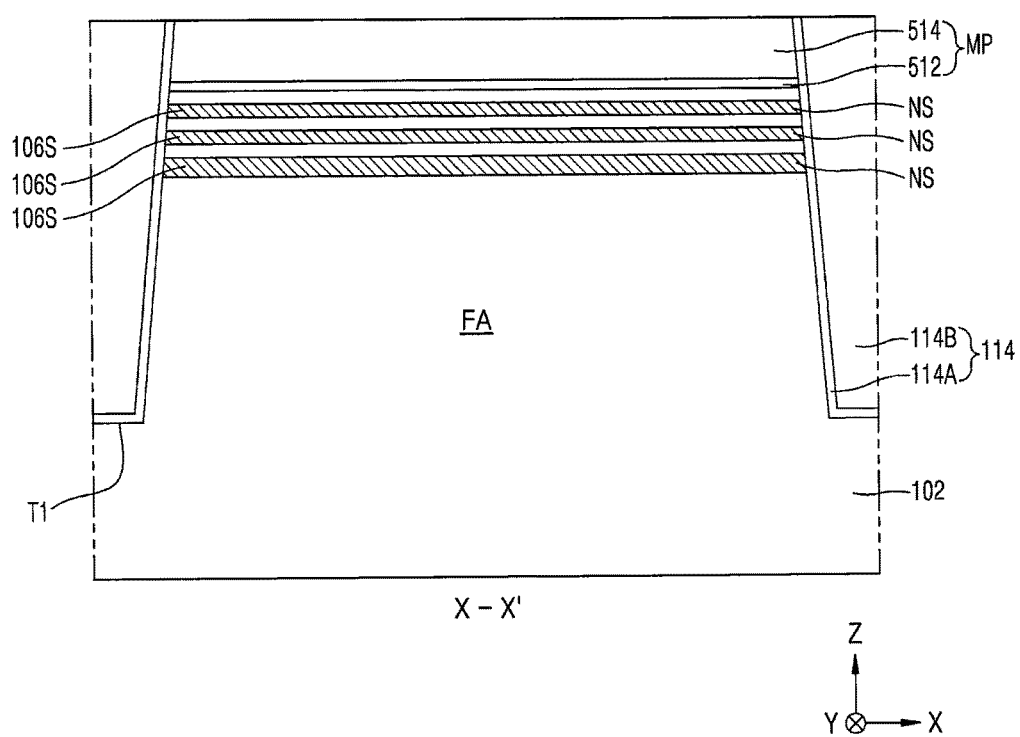
Figure 8B:
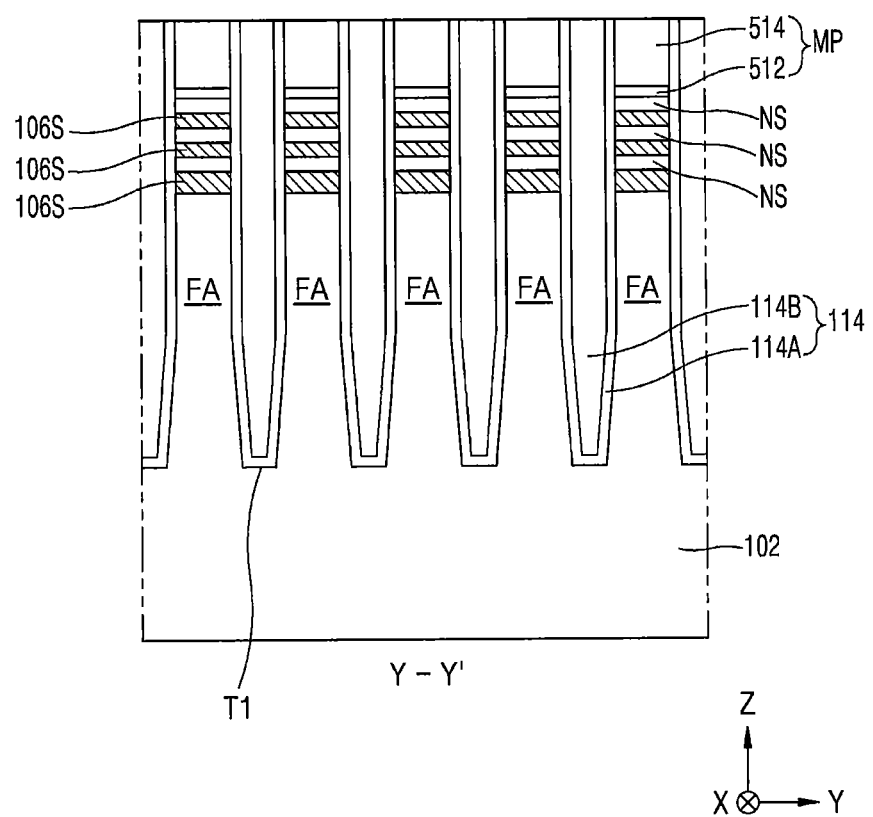

Referring to FIGS. 8A and 8B, the STI layer 114 including the insulating liner 114A and the gap-fill insulating layer 114B may be formed in the plurality of first trenches Ti.

Figure 9A:
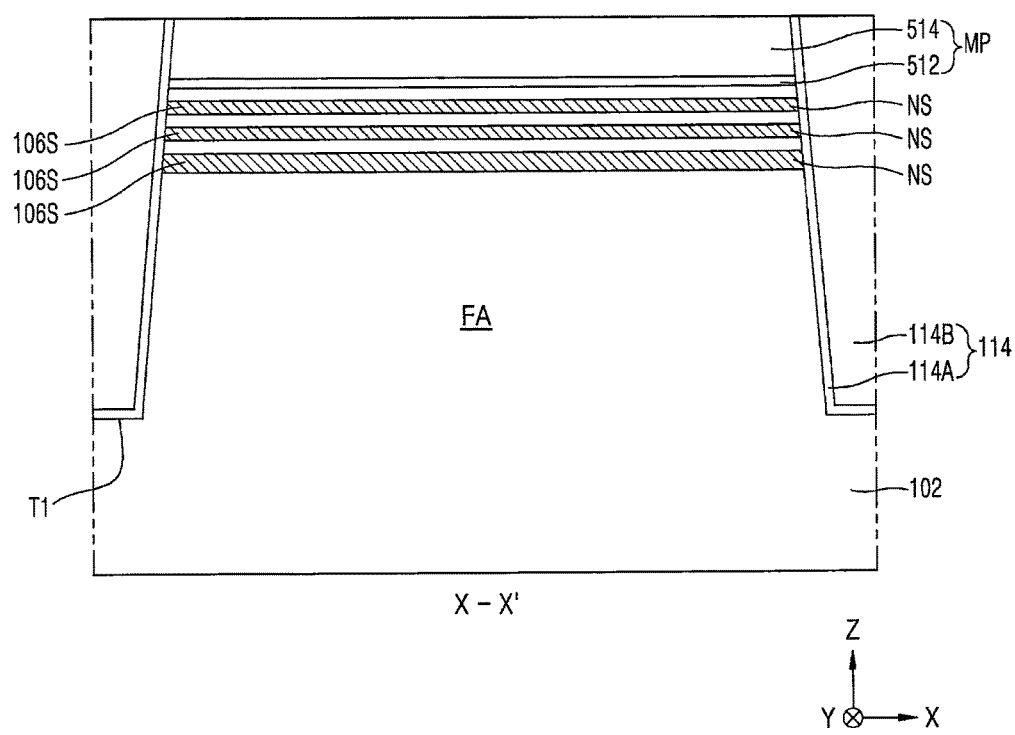
Figure 9B:
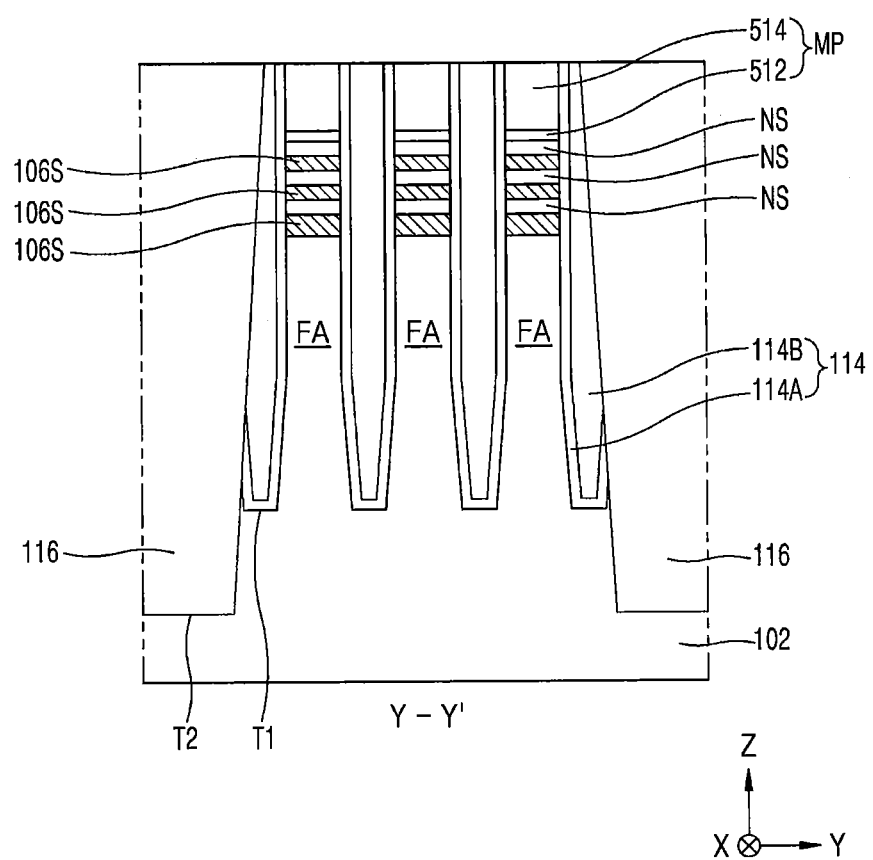

Referring to FIGS. 9A and 9B, the second trench T2 defining the device area DR (see FIG. 1A) may be formed by etching a partial structure from a resultant structure formed from the plurality of fin type active areas FA and the STI layer 114, and the device isolation layer 116 may be formed in the second trench T2.

Figure 10A:
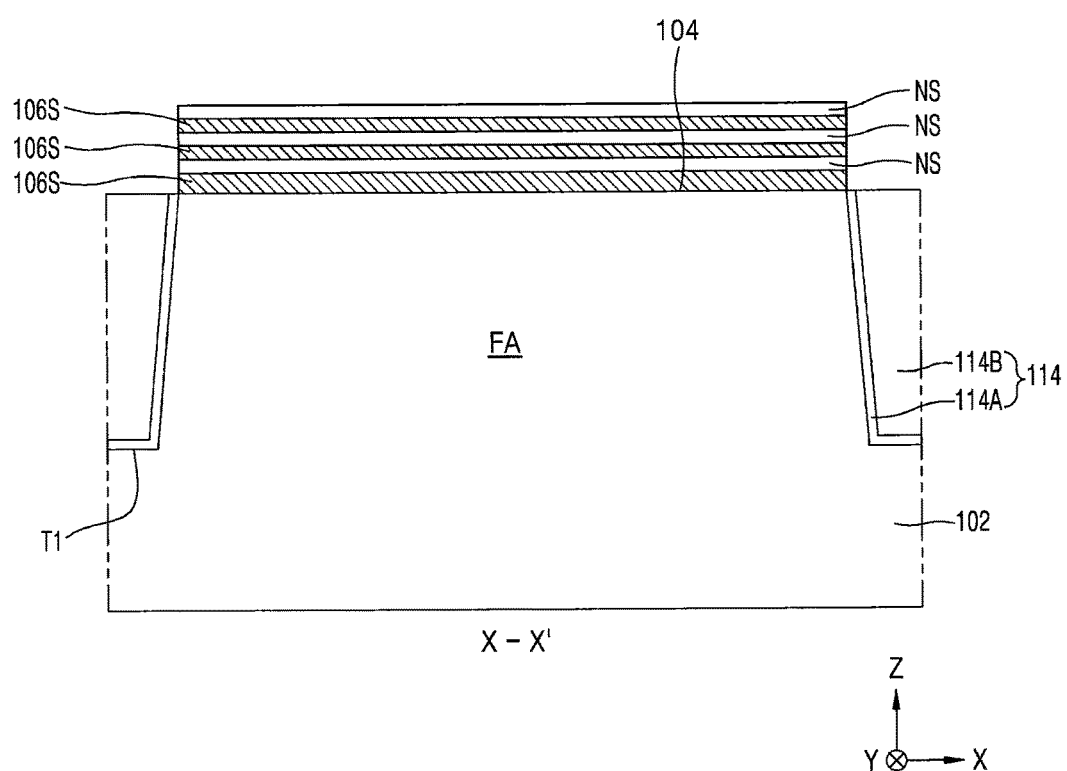
Figure 10B:
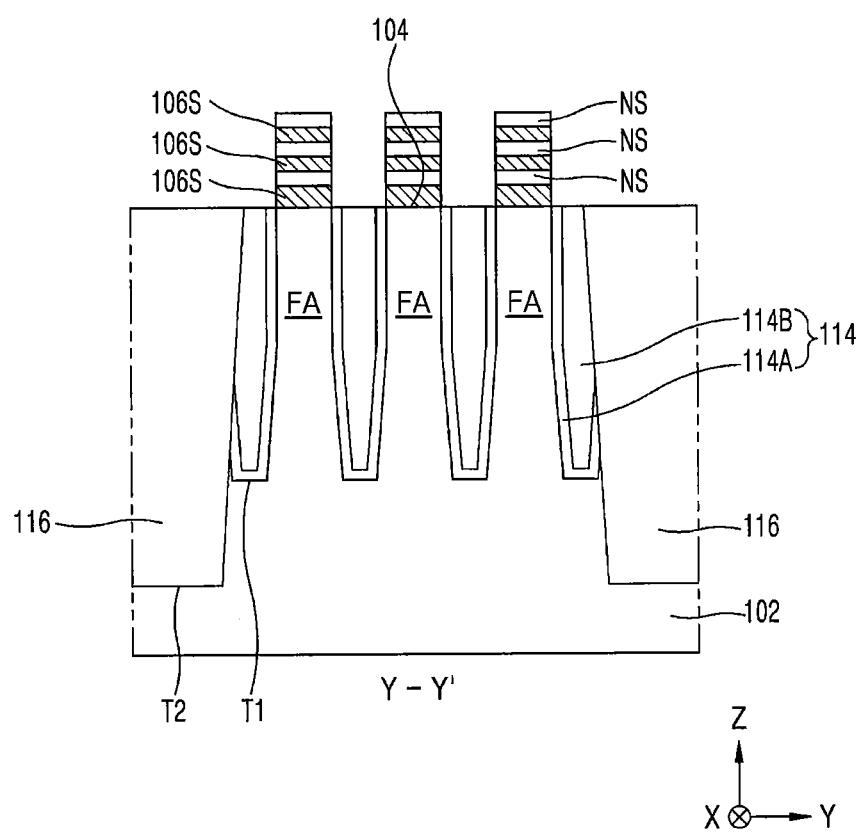

Referring to FIGS. 10A and 10B, the mask pattern MP remaining on the stack structure of the plurality of sacrifice semiconductor layers 106S and the plurality of nanosheet semiconductor layers NS may be removed, and a recess process may be performed to remove upper portions of the STI layer 114 and the device isolation layer 116 equal to partial thicknesses thereof.

The recess process may be performed on an upper surface of each of the STI layer 114 and the device isolation layer 116 to be approximately the same as or similar to a level of the upper surface 104 of the fin type active area FA. As a result, side walls of the stack structure of the sacrifice semiconductor layers 106S and the plurality of nanosheet semiconductor layers NS present on the plurality of fin type active areas FA may be exposed.

Dry etching, wet etching, or a combination of dry etching and wet etching may be used to perform the recess process.

In some embodiments, after the mask pattern MP is removed, before the recess process is performed to remove the upper portions of the STI layer 114 and the device isolation layer 116, an impurity ion injection process for injecting impurity ions for adjusting threshold voltages may be performed on the upper portions of the plurality of nanosheet semiconductor layers NS and the plurality of fin-type active areas FA. In some embodiments, during the impurity ion injection process for injecting impurity ions for adjusting threshold voltages, boron (B) ions may be injected into an area in which an NMOS transistor is formed as impurities, and phosphor (P) or arsenide (As) ions may be injected into an area in which a PMOS transistor is formed as impurities.

Figure 11A:
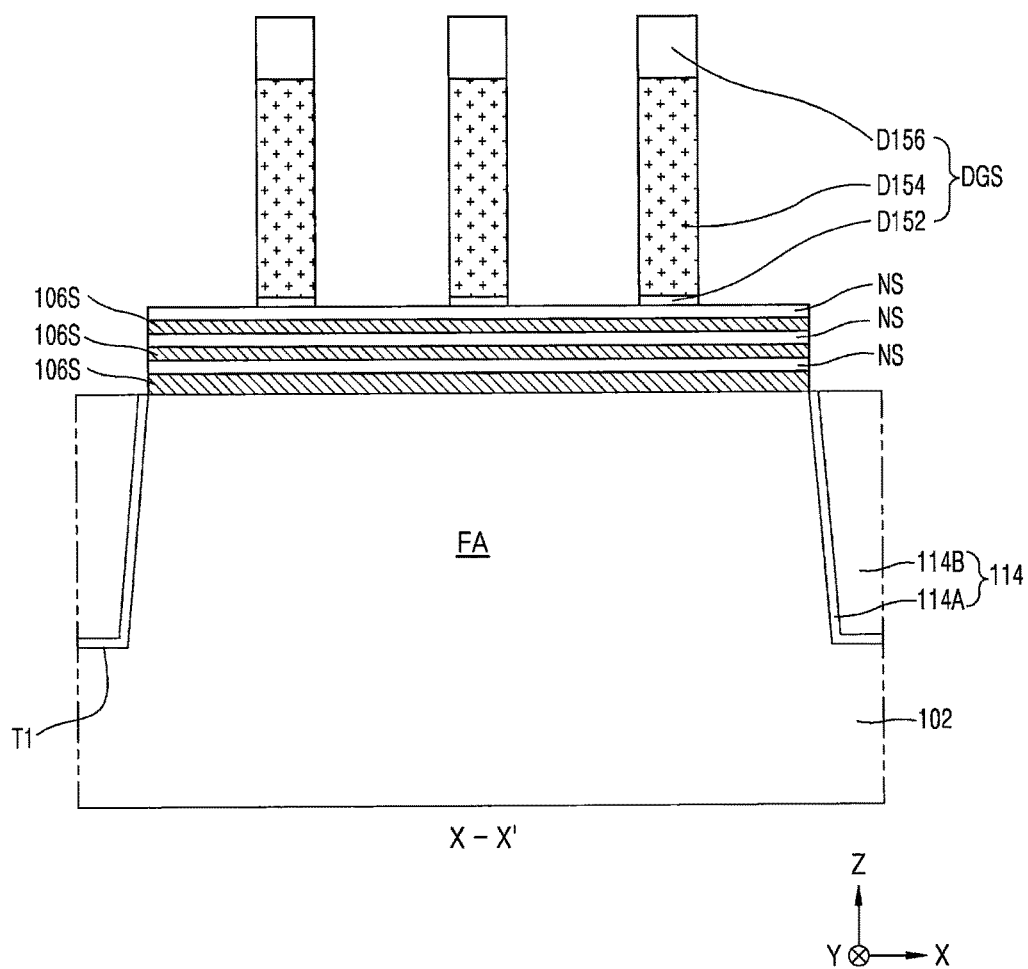
Figure 11B:
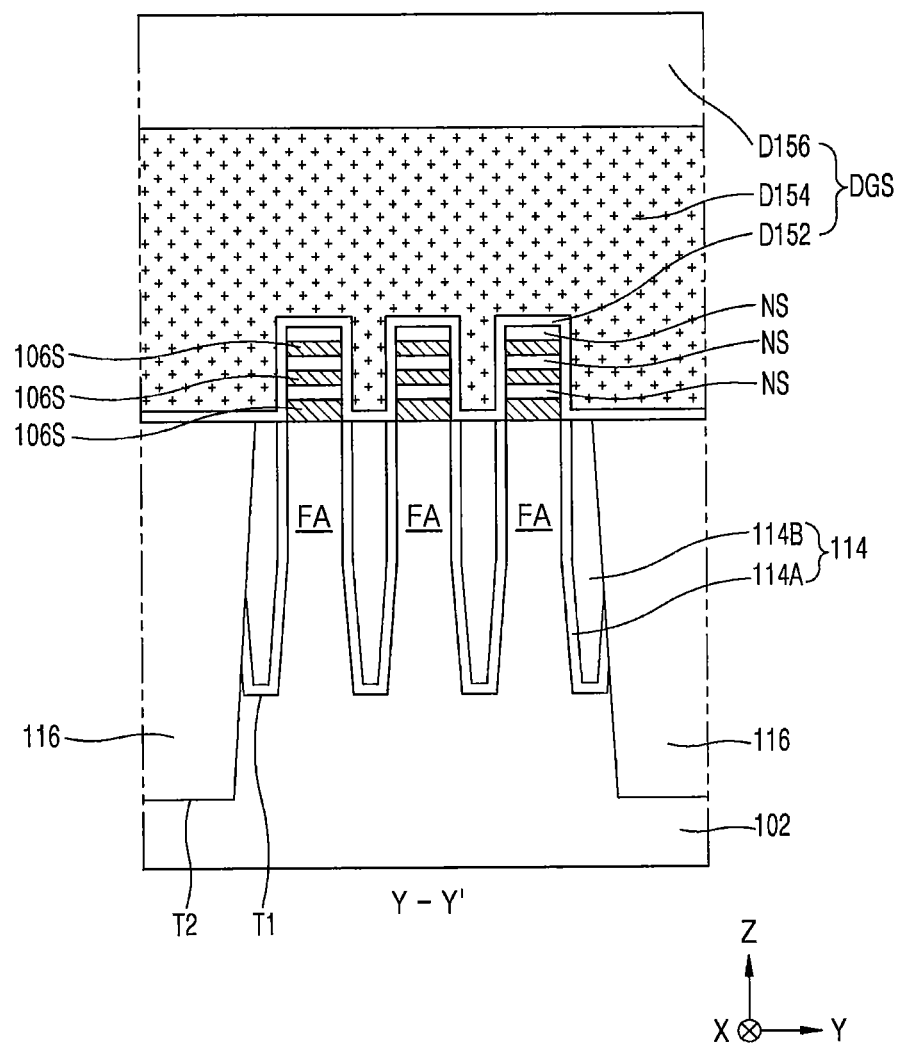

Referring to FIGS. 11A and 11B, a plurality of dummy gate structures DGS extending across the plurality of fin-type active areas FA may be formed on the plurality of fin-type active areas FA.

The dummy gate structures DGS may have a structure in which an oxide layer D152, a dummy gate layer D154, and a capping layer D156 are sequentially stacked. In an example of forming the dummy gate structures DGS, the oxide layer D152, the dummy gate layer D154, and the capping layer D156 may be sequentially formed to respectively cover an exposed surface of the stack structure of the plurality of sacrifice semiconductor layers 106S and the plurality of nanosheet semiconductor layers NS that cover the plurality of fin type active areas FA, an upper surface of the STI layer 114, and an upper surface of the device isolation layer 116 and then patterned, and, thus, the oxide layer D152, the dummy gate layer D154, and the capping layer D156 may be maintained only where necessary. The dummy gate structures DGS may be formed to have a planar shape corresponding to a planar shape of the gates 150 illustrated in FIG. 1A.

In some embodiments, the dummy gate layer D154 may include polysilicon, and the capping layer D156 may include a silicon nitride layer, but, embodiments of the inventive concept are not limited thereto.

Figure 12:
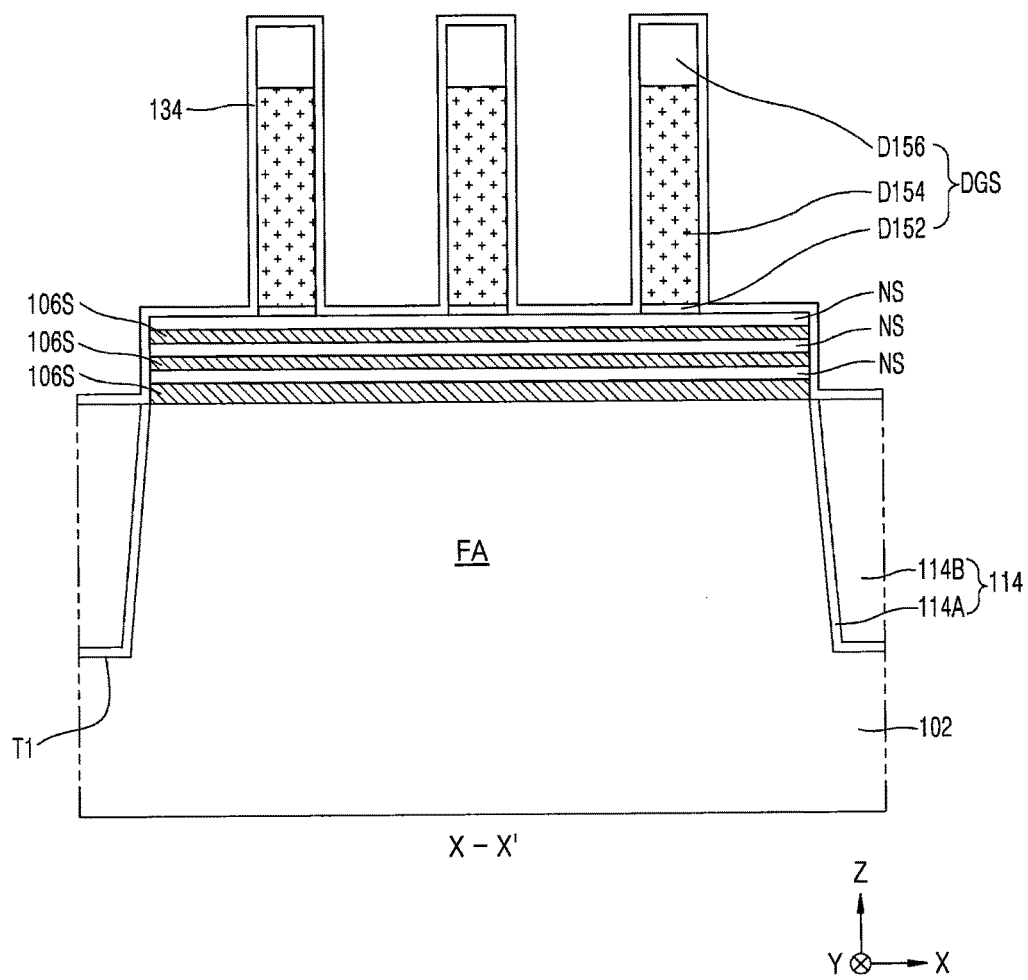

Referring to FIG. 12, the insulating liner 134 may be formed to cover an exposed surface of the dummy gate structures DGS, the exposed surface of the stack structure of the plurality of sacrifice semiconductor layers 106S and the plurality of nanosheet semiconductor layers NS, and the upper surface of each of the STI layer 114 and the device isolation layer 116.

In some embodiments, the insulating liner 134 may include a silicon nitride layer.

In some embodiments, after the insulating liner 134 is formed, a halo implantation region may be formed in the plurality of nanosheet semiconductor layers NS by injecting impurity ions in the plurality of nanosheet semiconductor layers NS. To form the halo implantation region, boron (B) ions may be injected into an area in which an NMOS transistor is formed as impurities, and phosphor (P) or arsenide (As) ions may be injected into an area in which a PMOS transistor is formed as impurities.

Figure 13:
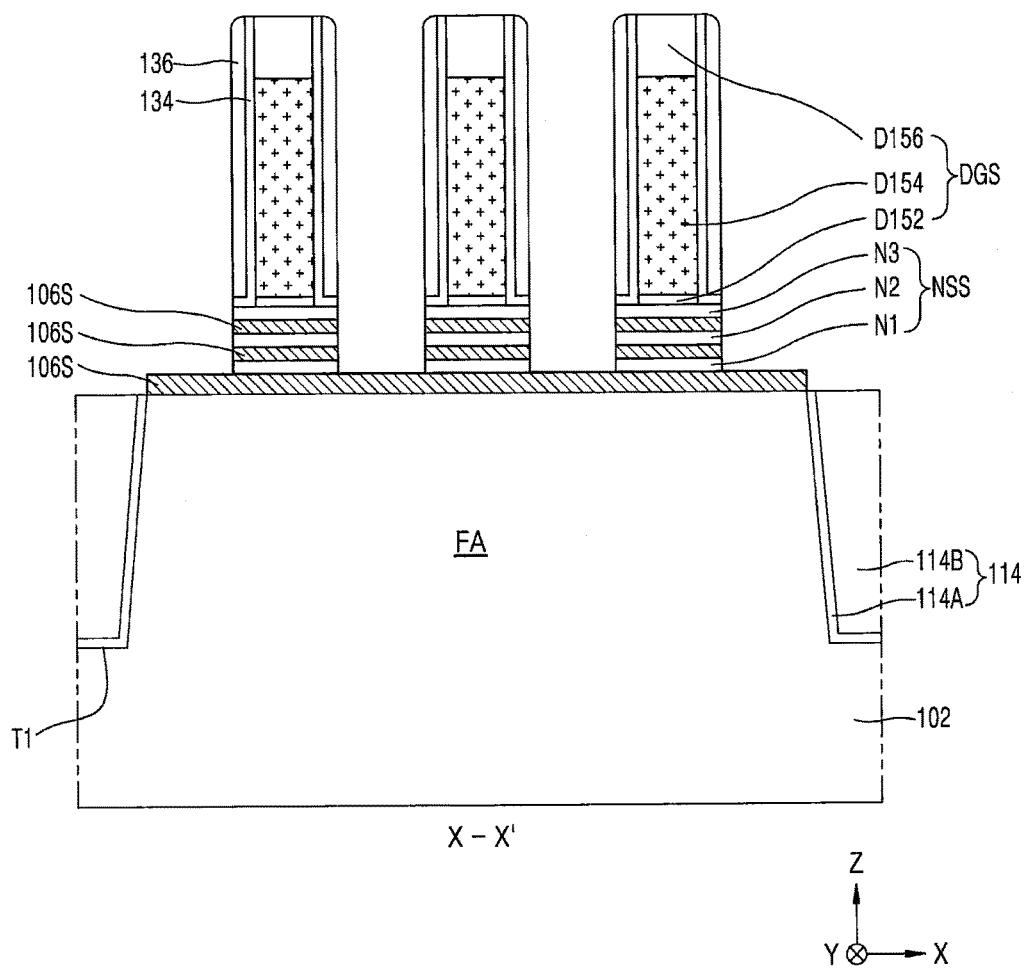

Referring to FIG. 13, the first insulating spacers 136 covering both side walls of the dummy gate structures DGS may be formed, a part of the stack structure of the plurality of sacrifice semiconductor layers 106S and the plurality of nanosheet semiconductor layers NS may be removed by etching by using the dummy gate structures DGS and the first insulating spacers 136 as an etching mask, and the plurality of nanosheet stack structures NSS including the plurality of nanosheets N1, N2, and N3 may be formed from the plurality of nanosheet semiconductor layers NS.

To form the first insulating spacers 136, after a spacer layer including a silicon nitride layer may be formed on a resultant structure of FIG. 12 in which the insulating liner 134 is formed, the first insulating spacers 136 may remain by etching back the spacer layer again.

When the stack structure of the plurality of sacrifice semiconductor layers 106S and the plurality of nanosheet semiconductor layers NS is etched, an etching process may be performed by using a point where the sacrifice semiconductor layer 106S that is the lowest layer among the plurality of sacrifice semiconductor layer 106S is exposed as an etching end point. Accordingly, after the plurality of nanosheet stack structures NSS is formed, the sacrifice semiconductor layers 106S covering the fin type active areas FA may be exposed between the plurality of nanosheet stack structures NSS. After the plurality of nanosheet stack structures NSS is formed, the sacrifice semiconductor layers 106S may remain between the fin type active area FA and the plurality of nanosheet stack structures NSS and between the plurality of nanosheets N1, N2, and N3.

Figure 14:
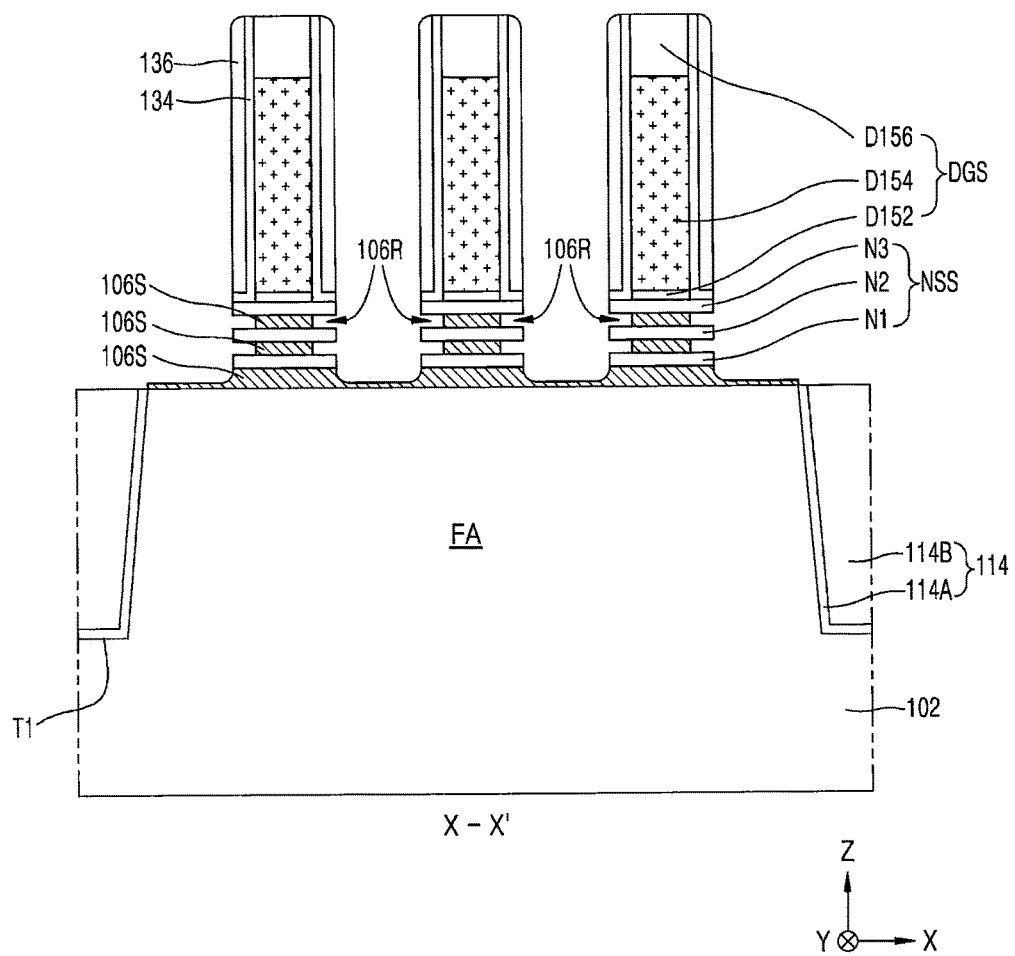

Referring to FIG. 14, an isotropic etching process may be used to form recess regions 106R between the plurality of nanosheets N1, N2, and N3 by removing some of the plurality of sacrifice semiconductor layers 106S exposed at both sides of each of the plurality of nanosheet stack structures NSS.

During the formation of the recess regions 106R, a part of an upper surface of an exposed portion of the lowest sacrifice semiconductor layer 106S covering the fin type active areas FA may be removed between the plurality of nanosheets N1, N2, and N3.

In some embodiments, the isotropic etching process for forming the recess regions 106R may be performed through a wet etching process that uses a difference in an etch selectivity between the plurality of sacrifice semiconductor layers 106S and the plurality of nanosheet stack structures NSS.

Figure 15A:
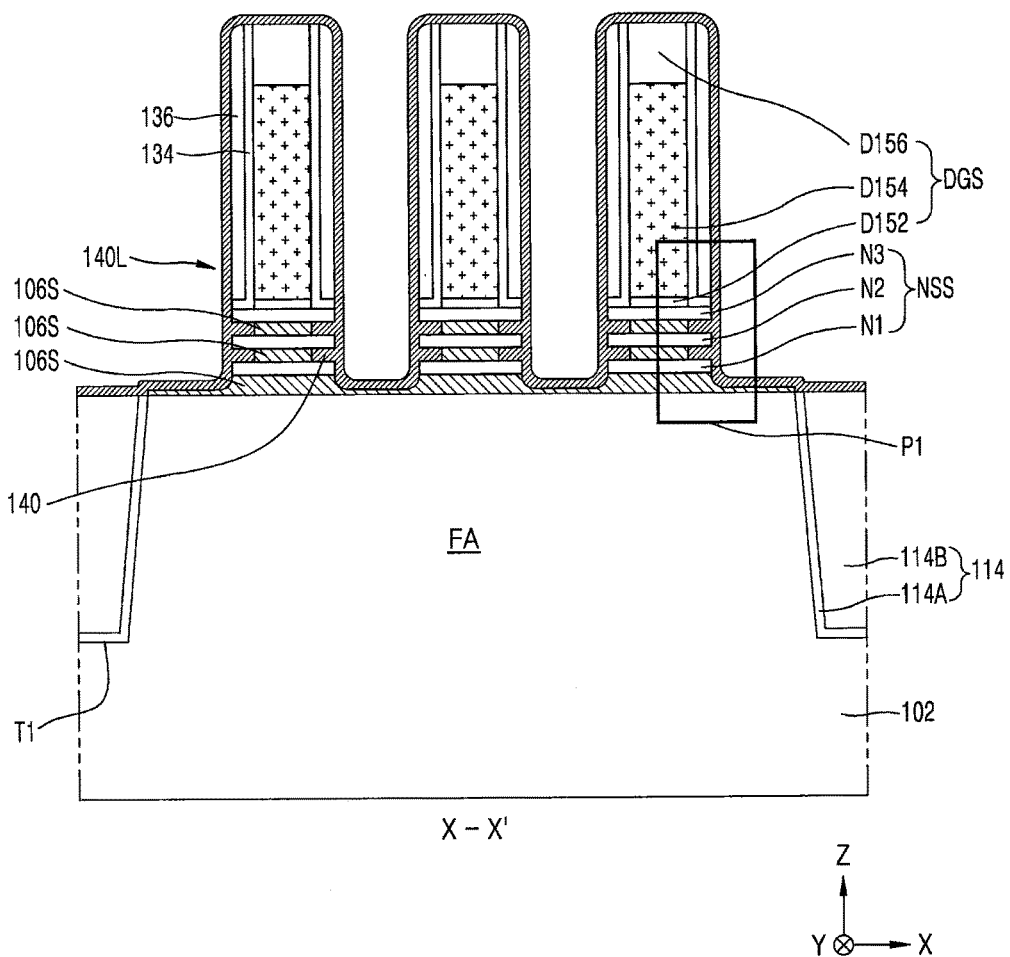

Referring to FIG. 15A, an insulating structure 140L including the plurality of second insulating spacers 140 filling the recess regions 106R (see FIG. 14) formed between the plurality of nanosheet stack structures NSS may be formed.

In some embodiments, the insulating structure 140L may include a plurality of insulating layers.

Figure 15B:
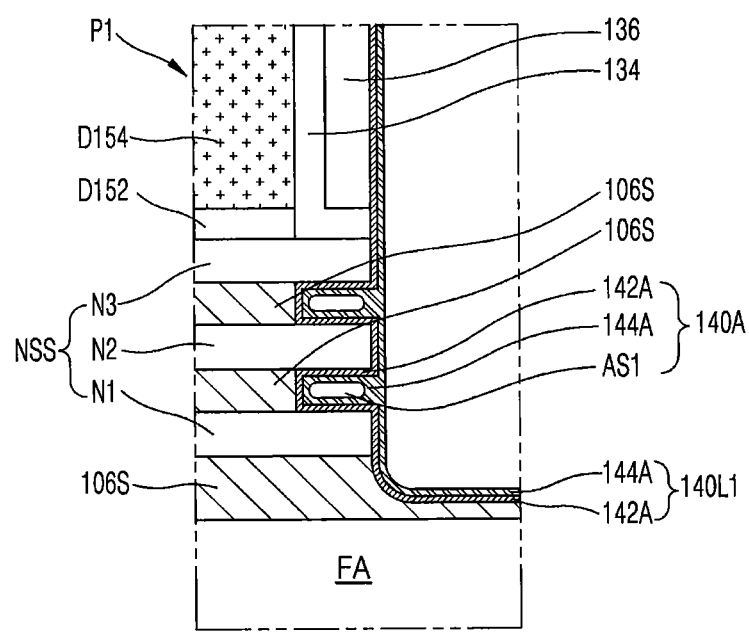
Figure 15C:
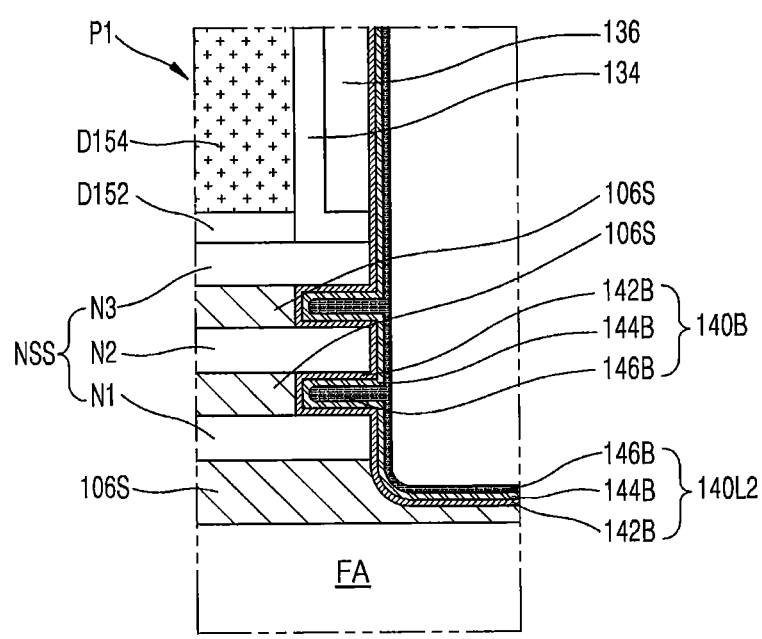
Figure 15D:
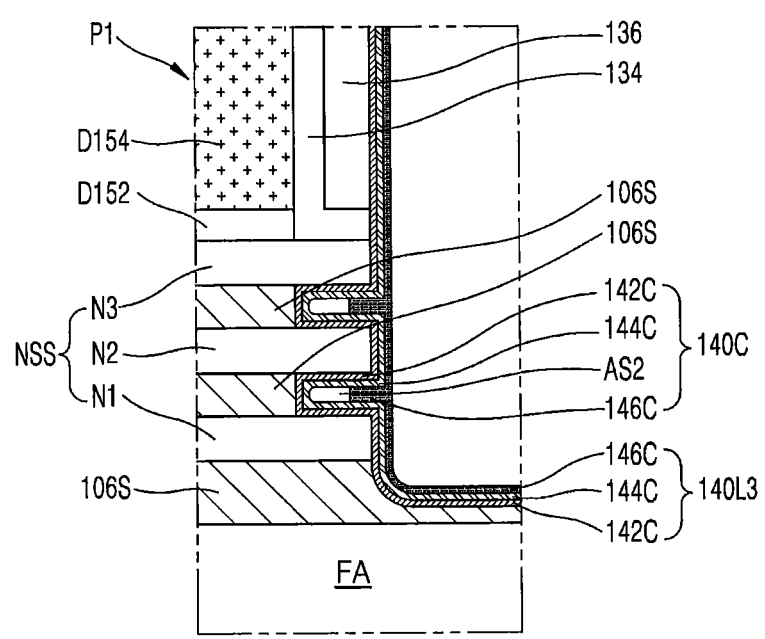

FIGS. 15B through 15D are cross-sectional views of various insulating structures 140L1, 140L2, and 140L3 that are employable as the insulating structure 140L including the plurality of second insulating spacers 140, by expanding a portion corresponding to an area P1 of FIG. 15A.

In some embodiments, to form the insulating structure 140L including the second insulating spacers 140 illustrated in FIG. 15A, the insulating structure 140L1 including the second insulating spacer 140A illustrated in FIG. 15B may be formed.

The insulating structure 140L1 may include the first liner 142A and the second liner 144A that are sequentially formed from inner side walls of the recess region 106R (see FIG. 14). The insulating structure 140L1 may further include the air space AS1 limited by the second liner 144A in the recess region 106R.

To form the first liner 142A and the second liner 144A, an ALD process, a CVD process, an oxidation process, or a combination thereof may be used. To form the air space AS1 limited by the second liner 144A in the recess region 106R, a step coverage characteristic may be controlled during a deposition process for forming the second liner 144A. The second liner 144A may be formed to include a portion contacting the first liner 142A between the plurality of nanosheet stack structures NSS and a portion spaced apart from the first liner 142A having the air space AS1 therebetween between the plurality of nanosheet stack structures NSS.

More detailed descriptions of the first liner 142A and the second liner 144A are the same as described with reference to FIG. 2A above.

In some other embodiments, to form the insulating structure 140L including the second insulating spacers 140 illustrated in FIG. 15A, the insulating structure 140L2 including the second insulating spacer 140B illustrated in FIG. 15C may be formed.

The insulating structure 140L2 may include the first liner 142B, the second liner 144B, and the burial layer 146B that are sequentially formed from inner side walls of the recess region 106R (see FIG. 14). The first liner 142B, the second liner 144B, and the burial layer 146B may include different materials.

To form the first liner 142B, the second liner 144B, and the burial layer 146B, an ALD process, a CVD process, an oxidation process, or a combination thereof may be used.

More detailed descriptions of the first liner 142B, the second liner 144B, and the burial layer 146B are the same as described with reference to FIG. 2B above.

In some other embodiments, to form the insulating structure 140L including the second insulating spacers 140 illustrated in FIG. 15A, the insulating structure 140L3 including the second insulating spacer 140C illustrated in FIG. 15D may be formed.

The insulating structure 140L3 may include the first liner 142C, the second liner 144C, and the partial burial layer 146C that are sequentially formed from inner side walls of the recess region 106R (see FIG. 14). The insulating structure 140L3 may further include the air space AS2 limited by the second liner 144C and the partial burial layer 146C in the recess region 106R.

To form the first liner 142C, the second liner 144C, and the partial burial layer 146C, an ALD process, a CVD process, an oxidation process, or a combination thereof may be used.

In an example of forming the air space AS2, a step coverage characteristic may be controlled during a deposition process for forming the partial burial layer 146C such that the air space AS2 may remain in the recess region 106R.

More detailed descriptions of the first liner 142C, the second liner 144C, and the partial burial layer 146C are the same as described with reference to FIG. 2C above.

Figure 16A:
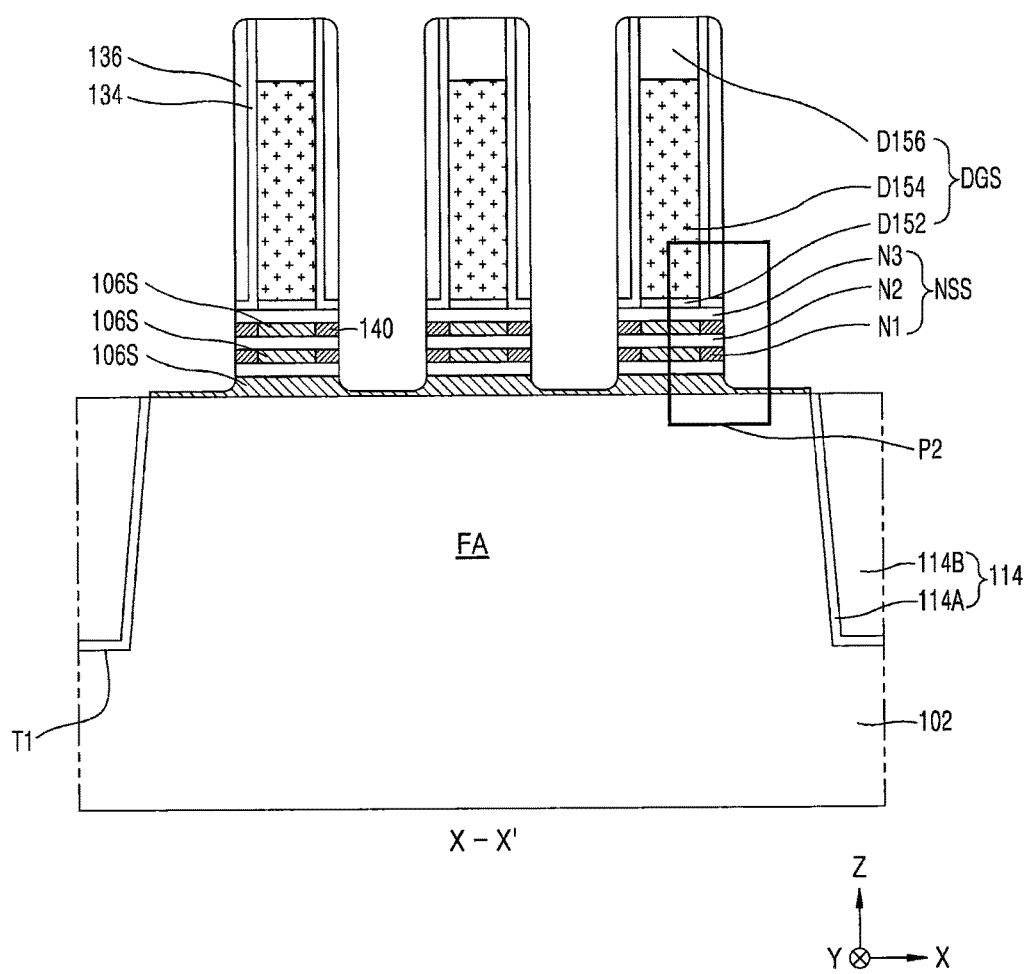

Referring to FIG. 16A, the second insulating spacer 140 filling the recess region 106R may remain by removing a portion of the insulating structure 140L (see FIG. 15A) outside the recess region 106R (see FIG. 14).

Figure 16B:
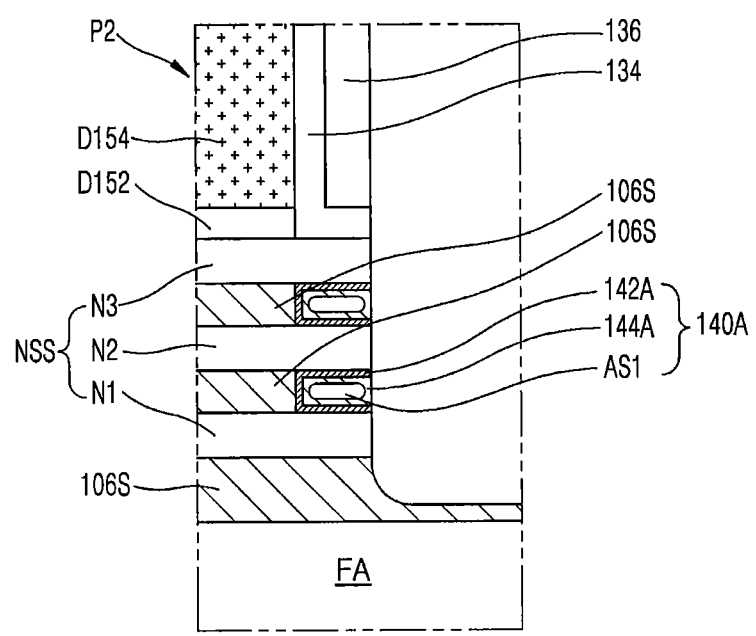
Figure 16C:
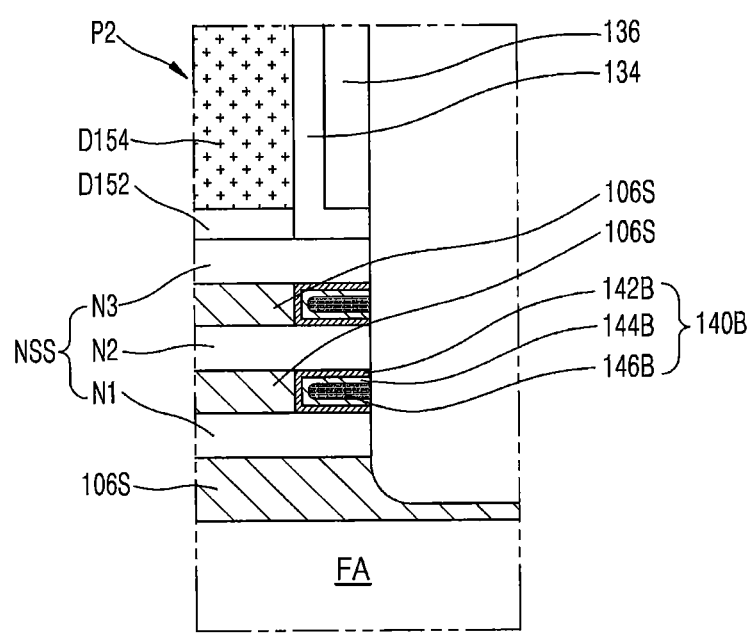
Figure 16D:
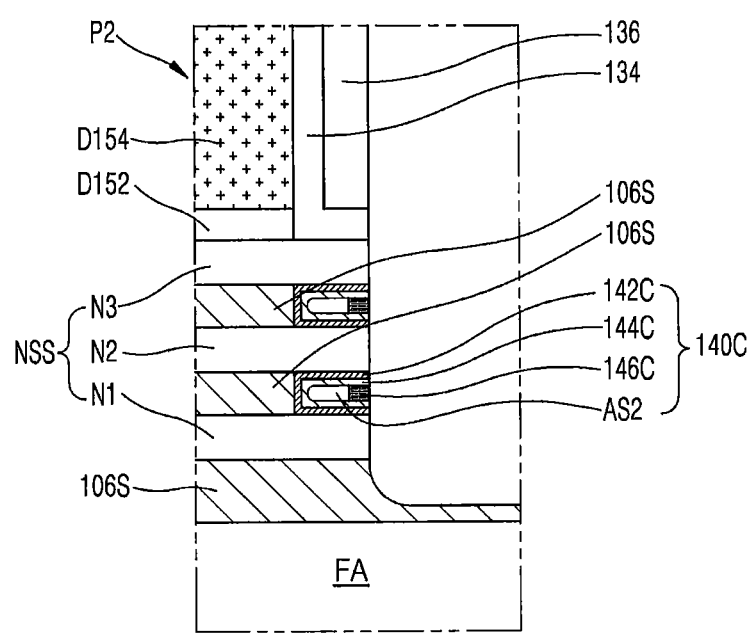

FIGS. 16B through 16D are cross-sectional views of various configurations obtained after removing the portion of the insulating structure 140L outside the recess region 106R (see FIG. 14) by expanding a portion corresponding to an area P2 of FIG. 16A.

In some embodiments, as shown in FIG. 16B, the second insulating spacer 140A remaining in the recess region 106R (see FIG. 14) after removing the portion of the insulating structure 140L outside the recess region 106R (see FIG. 14) may include the first liner 142A and the second liner 144A. The second insulating spacer 140A may further include the air space AS1 limited by the first liner 142A and the second liner 144A.

In some embodiments, as shown in FIG. 16C, the second insulating spacer 140B remaining in the recess region 106R (see FIG. 14) after removing the portion of the insulating structure 140L outside the recess region 106R (see FIG. 14) may include the first liner 142B, the second liner 144B, and the burial layer 146B.

In some embodiments, as shown in FIG. 16D, the second insulating spacer 140C remaining in the recess region 106R (see FIG. 14) after removing the portion of the insulating structure 140L outside the recess region 106R (see FIG. 14) may include the first liner 142C, the second liner 144C, and the partial burial layer 146C. The second insulating spacer 140C may further include the air space AS2 limited by the second liner 144C and the partial burial layer 146C.

Referring to FIG. 16A, after removing the portion of the insulating structure 140L illustrated in FIG. 15A outside the recess region 106R (see FIG. 14), both side walls of the nanowires N1, N2, and N3, the plurality of second insulating spacers 140, and the sacrifice semiconductor layer 106S that is the lowest layer among the plurality of sacrifice semiconductor layers 106S may be exposed.

Figure 17:
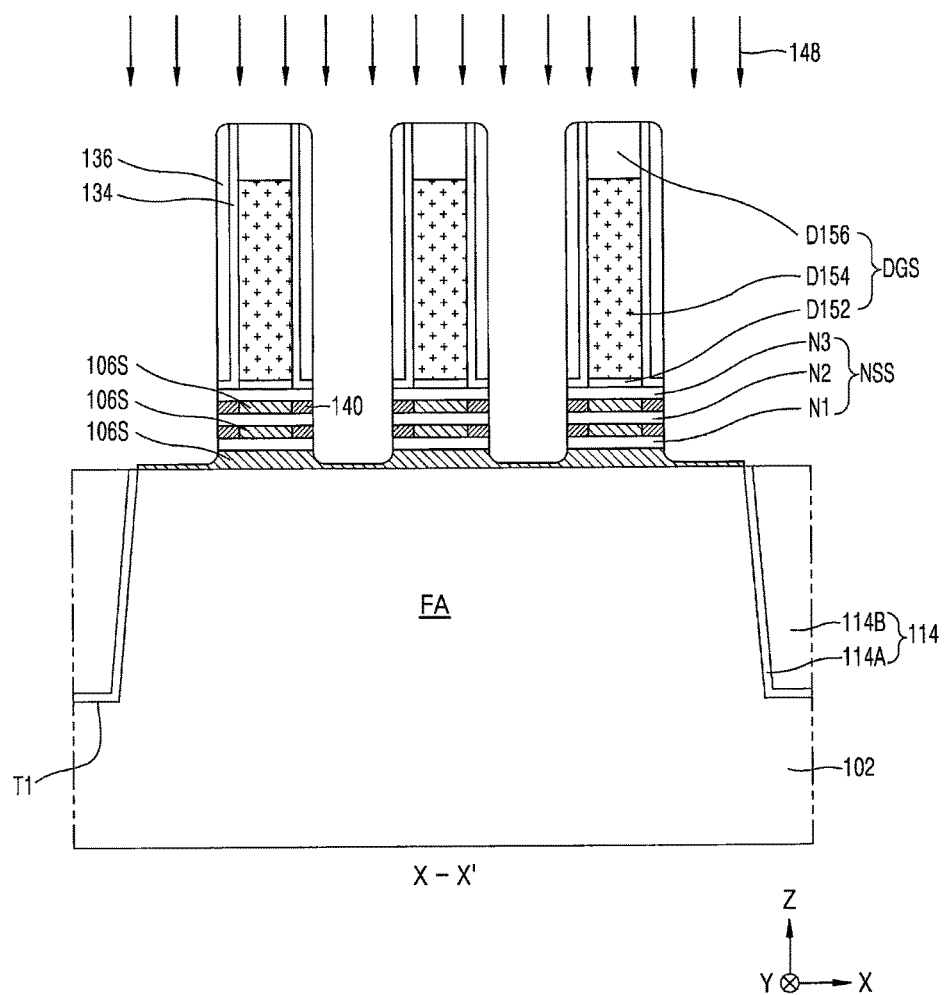

Referring to FIG. 17, the exposed side walls of the nanowires N1, N2, and N3 and the exposed surface of the sacrifice semiconductor layer 106S that is the lowest layer among the plurality of sacrifice semiconductor layers 106S may be exposed in a cleaning atmosphere 148, and, thus, a natural oxide layer may be removed from the exposed both side walls and the exposed surfaces.

In some embodiments, a first cleaning process using a wet cleaning process, a second cleaning process using a SiCoNi™ etching process, or a combination thereof may be used as the cleaning atmosphere 148. During the wet cleaning process, DHF (diluted HF), $NH_4OH$, TMAH (tetramethyl ammonium hydroxide), KOH (potassium hydroxide) solution, etc. may be used. The SiCoNi™ etching process may be performed using a hydrogen source of ammonia $NH_3$ and a fluorine source of nitrogen trifluoride $NF_3$.

During a cleaning process for removing the natural oxide layer, insulating layers constituting the second insulating spacers 140, in particular, insulating layers exposed to the cleaning atmosphere 148, may be configured as materials having an etching resistance with respect to the cleaning atmosphere 148, and, thus, the second insulating spacers 140 may not be consumed during the removing of the natural oxide layer under the cleaning atmosphere 148. More details of appropriate insulating materials constituting the second insulating spacers 140 are the same as described with reference to FIGS. 2A through 2C.

Figure 18:
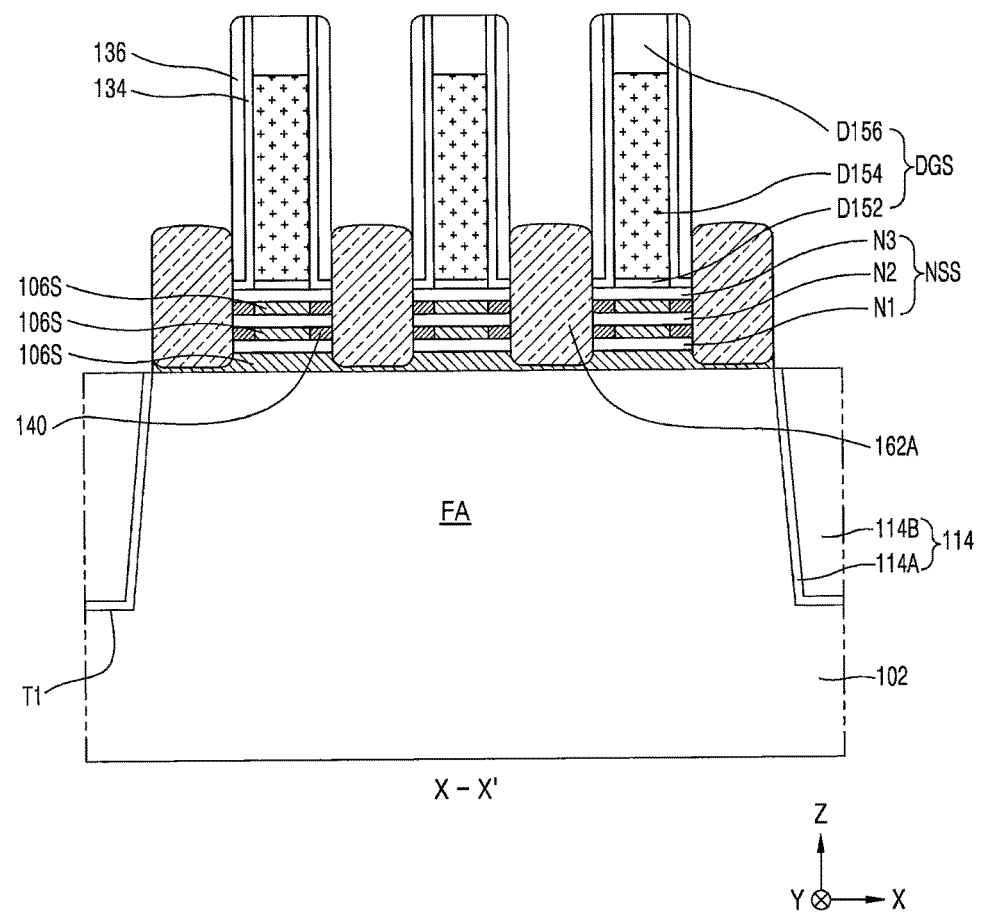

Referring to FIG. 18, the semiconductor layer 162A for forming the source and drain regions 162 (see FIG. 1B) may be formed by epitaxially growing a semiconductor material from both side walls exposed to the plurality of nanosheets N1, N2, and N3 from which the natural oxide layer is removed.

As described with reference to FIGS. 1A through 1C above, the first insulating spacers 136 may include an insulating layer in which seeding and epitaxial growth of a semiconductor atom are impossible on its surface, and the second insulating spacers 140 may include an insulating layer in which seeding and epitaxial growth of a semiconductor atom are possible on at least a part of its surface, and thus an epitaxial growth process for forming the semiconductor layer 162A may be performed not only on the exposed both side walls of the plurality of nanowires N1, N2, and N3 but also on surfaces of the second insulating spacers 140, thereby facilitating the formation of the semiconductor layer 162A and forming the semiconductor layer 162A having a good characteristic without a void.

Figure 19:
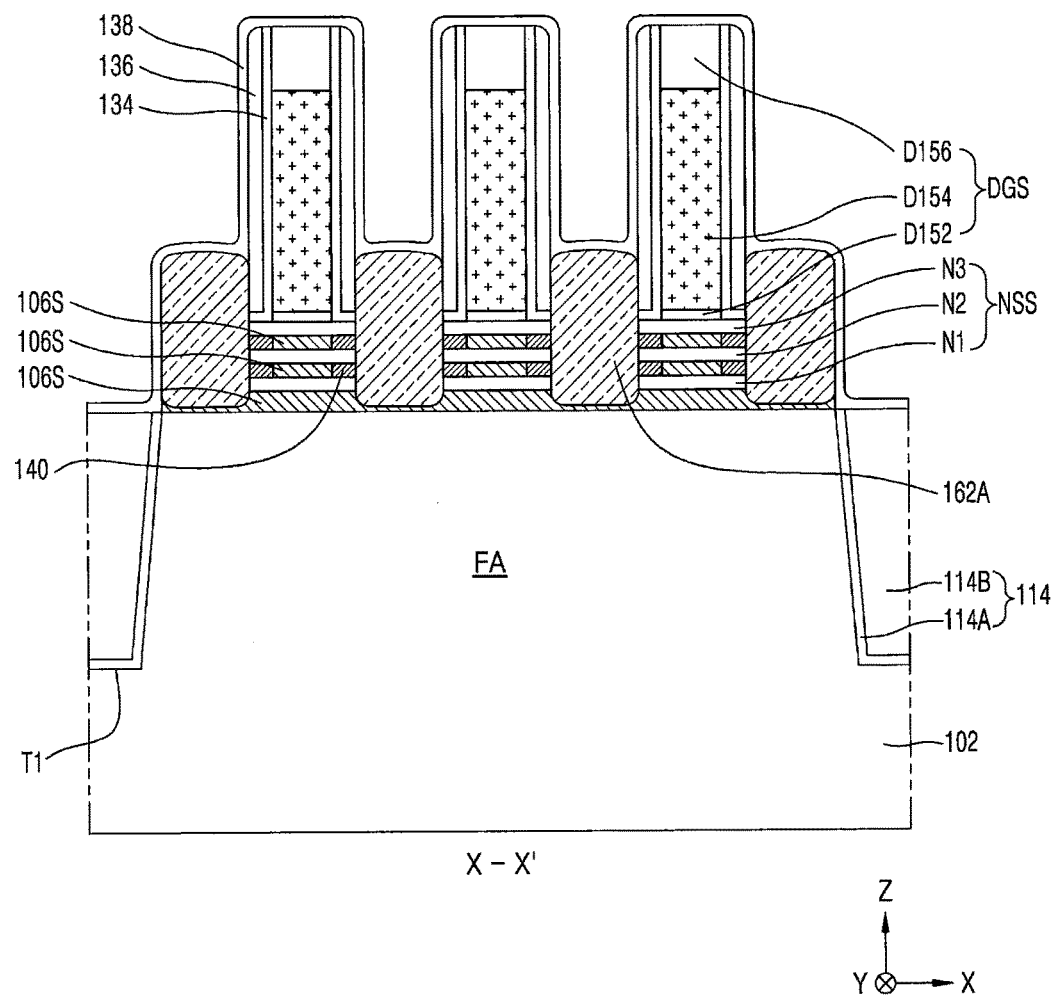

Referring to FIG. 19, the protection layer 138 covering a resultant structure in which the semiconductor layer 162A is formed may be formed.

In some embodiments, the protection layer 138 may include a silicon nitride layer. To form the protection layer 138, the ALD process or the CVD process may be used.

Figure 20:
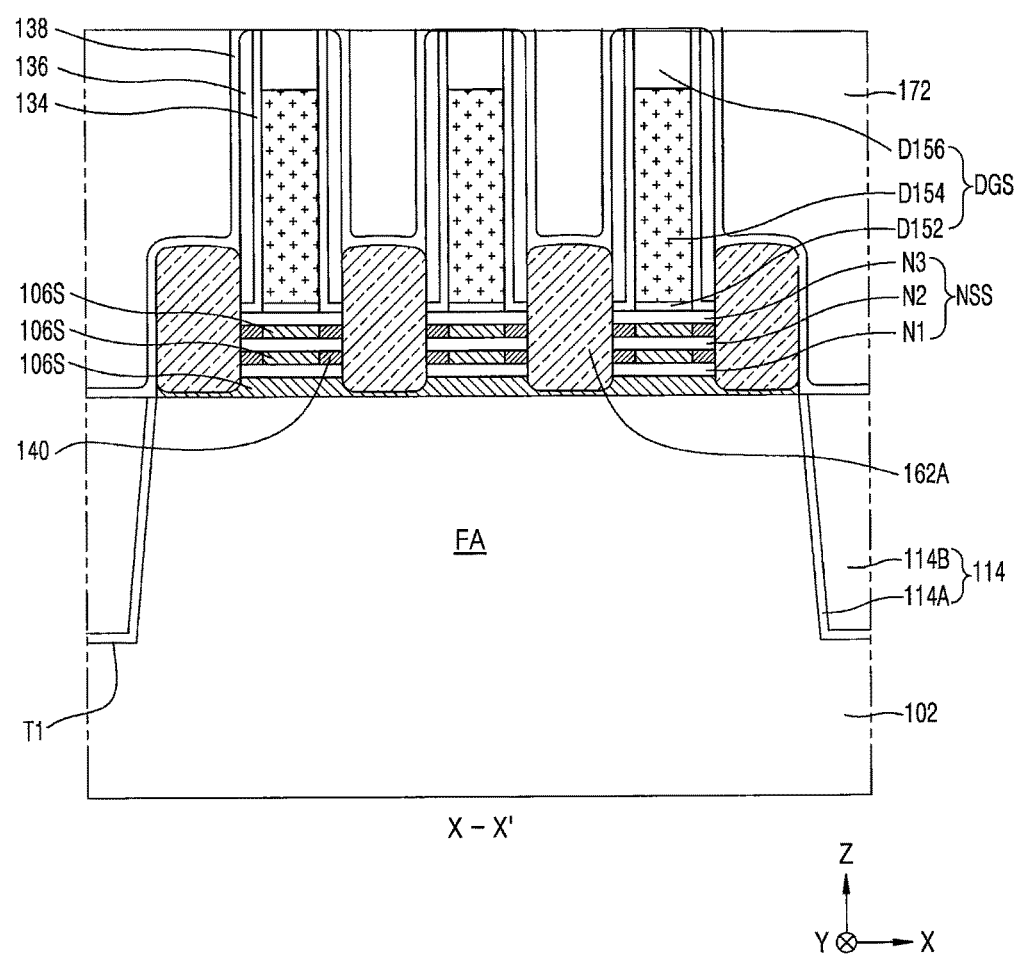

Referring to FIG. 20, after the inter-gate insulating layer 172 is formed on the protection layer 138, an upper surface of the capping layer D156 may be exposed by planarizing the inter-gate insulating layer 172.

Figure 21:
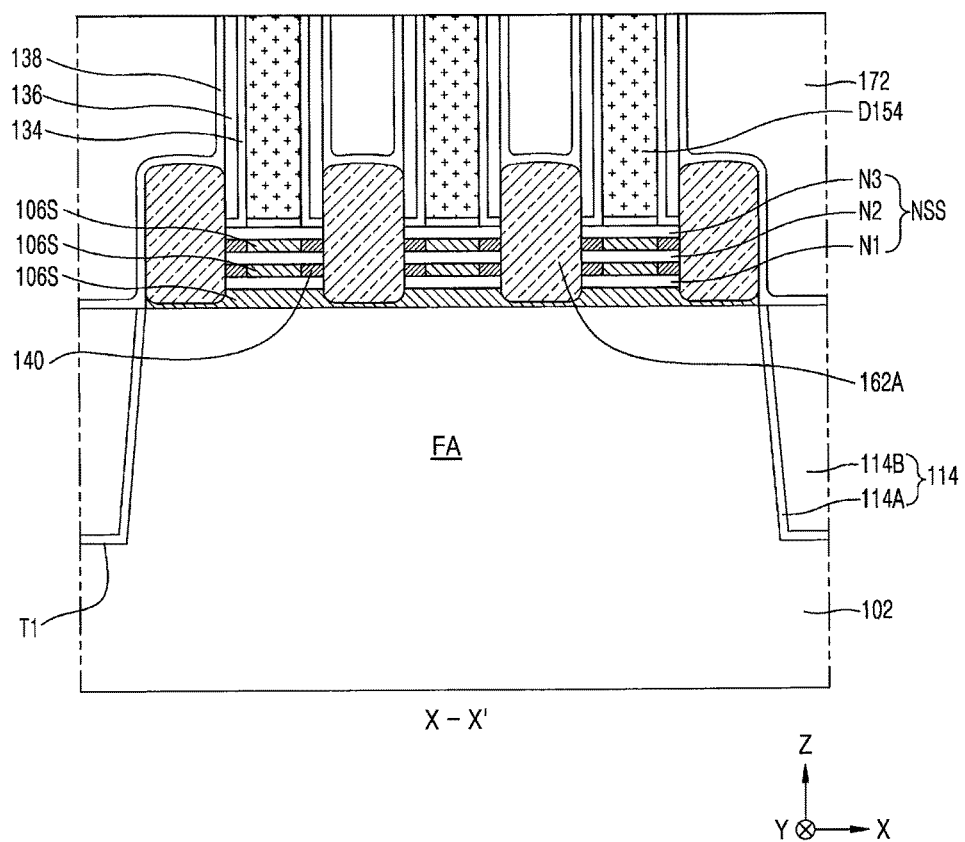

Referring to FIG. 21, the capping layer D156 (see FIG. 20) covering an upper surface of the dummy gate layer D154, and the insulating liner 134, the first insulating spacer 136, and the protection layer 138 that surround the capping layer D156 may be etched back, and an upper portion of the inter-gate insulating layer 172 may be polished to a depth equal to a partial thickness thereof, such that the upper surface of the inter-gate insulating layer 172 may be located at an approximately same level as that of the upper surface of the dummy gate layer D154.

Figure 22:
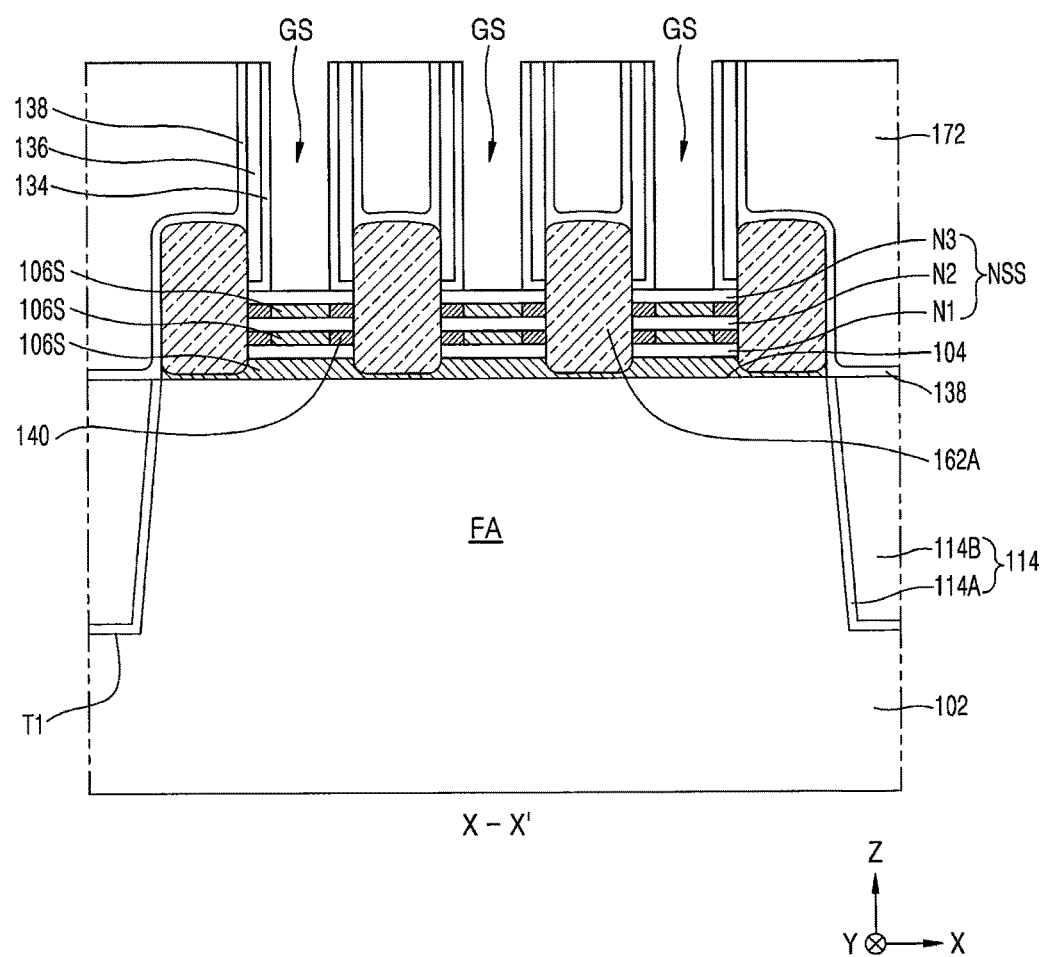

Referring to FIG. 22, the dummy gate layer D154 exposed through the inter-gate insulating layer 172 and the oxide layer D152 present below the dummy gate layer D154 may be removed, such that the nanosheet N3 may be exposed through gate spaces GS.

Figure 23:
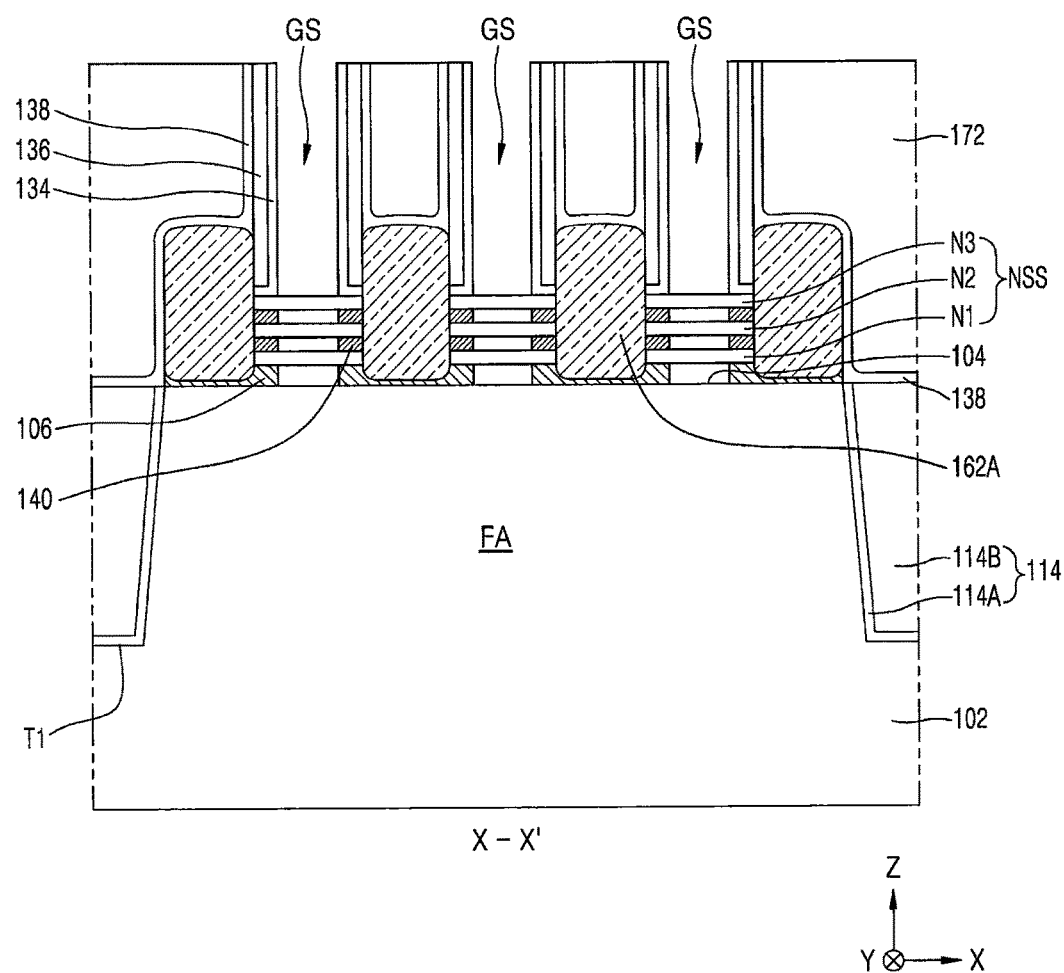

Referring to FIG. 23, parts of the plurality of sacrifice semiconductor layers 106S remaining on the fin type active area FA may be removed, such that the plurality of nanosheets N1, N2, and N3 and the upper surface 104 of the fin type active area FA may be partially exposed through the gate spaces GS.

The sacrifice semiconductor layer 106S that is the lowest layer among the plurality of sacrifice semiconductor layers 106S may not be completely removed so that a part of the sacrifice semiconductor layer 106S may remain on the fin type active area FA in a lower portion of the second insulating spacer 140. A portion of the sacrifice semiconductor layer 106S remaining on the fin type active area FA may constitute the buffer semiconductor layer 106.

Figure 24:
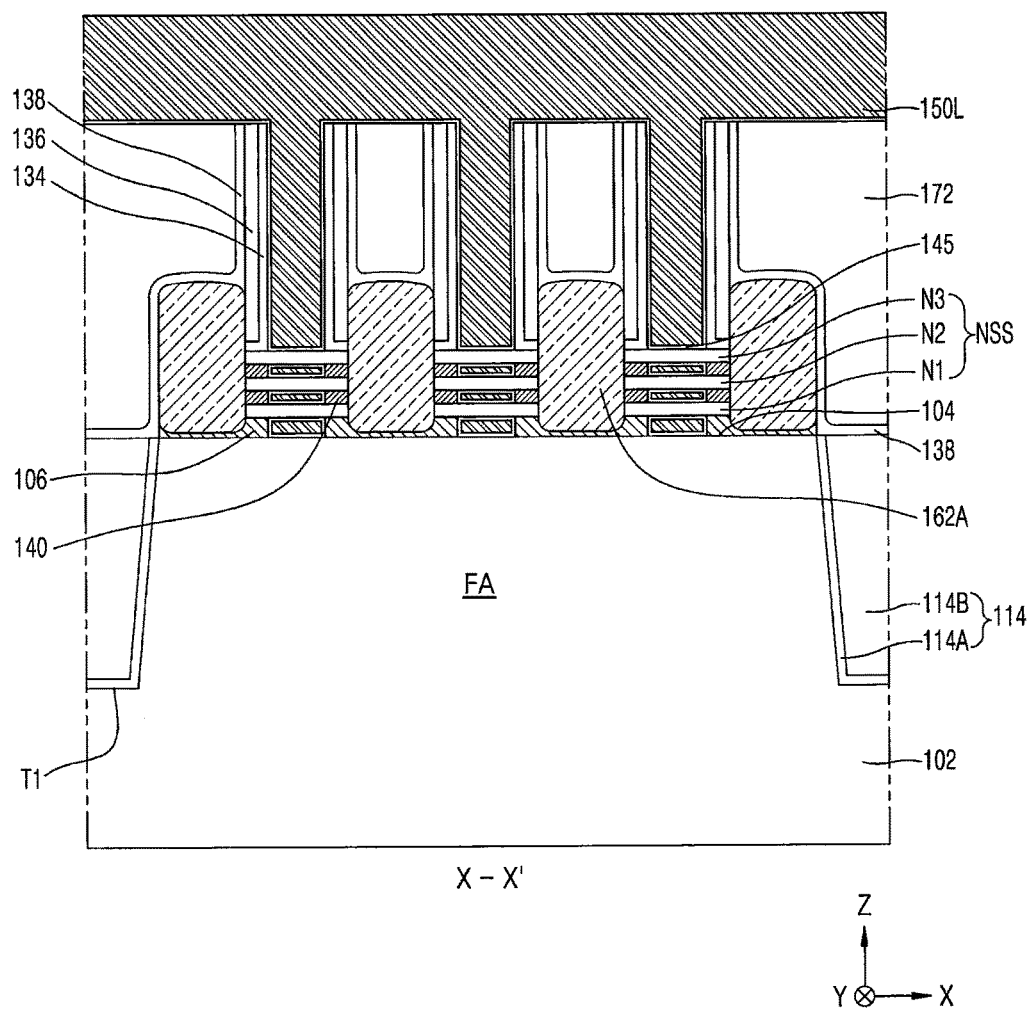

Referring to FIG. 24, after the natural oxide layer is removed from the exposed surfaces of the plurality of nanosheets N1, N2, and N3 and the fin type active area FA, the gate dielectric layer 145 may be formed on surfaces exposed by the gate spaces GS (see FIG. 23), and a gate forming conductive layer 150L covering the inter-gate insulating layer 172 may be formed while filling the gate spaces GS on the gate dielectric layer 145.

Figure 25:
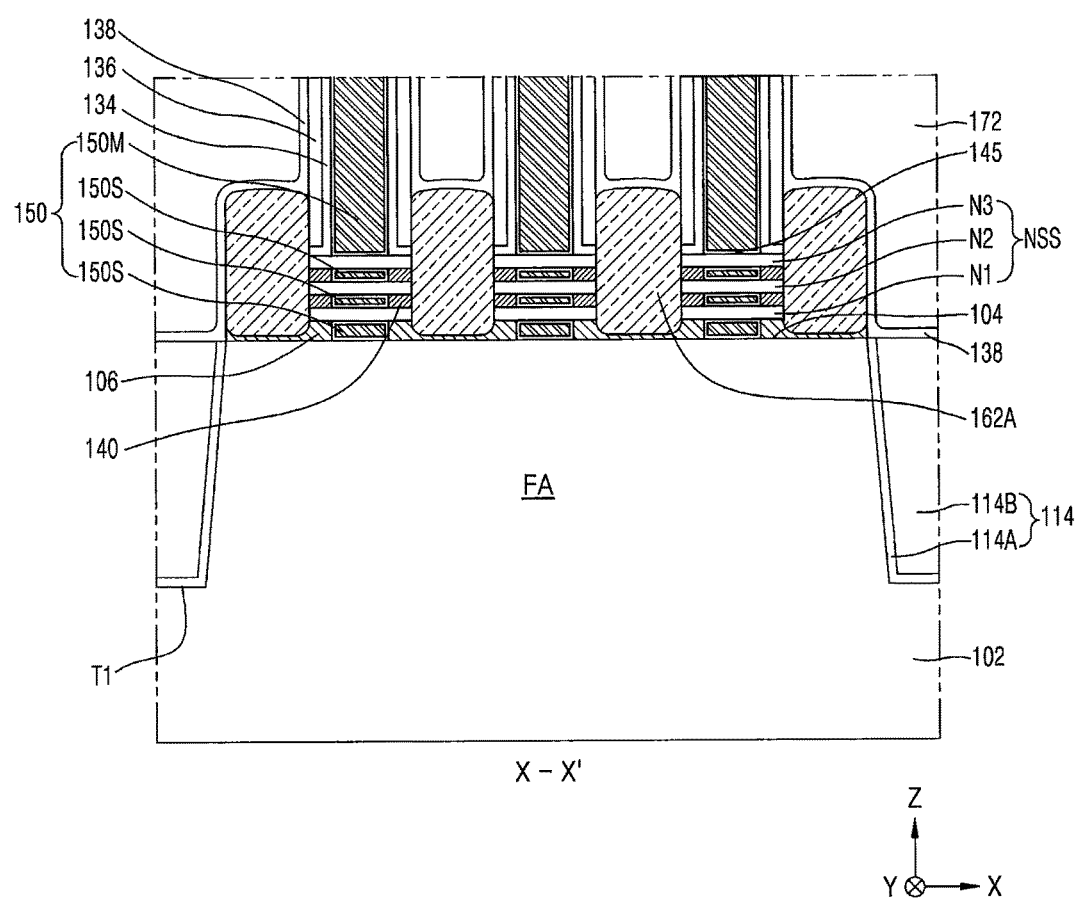

Referring to FIG. 25, a part of an upper surface of the gate forming conductive layer 150L (see FIG. 24) may be removed until an upper surface of the inter-gate insulating layer 172 is exposed, and the gate 150 filling the gate spaces GS may be formed.

The gate 150 may include the main gate portion 150M covering an upper surface of the nanosheet stack structure NSS including the plurality of nanosheets N1, N2, and N3 and the plurality of sub-gate portions 150S connected to the main gate portion 150M and formed in spaces between the plurality of nanosheets N1, N2, and N3.

Figure 26:
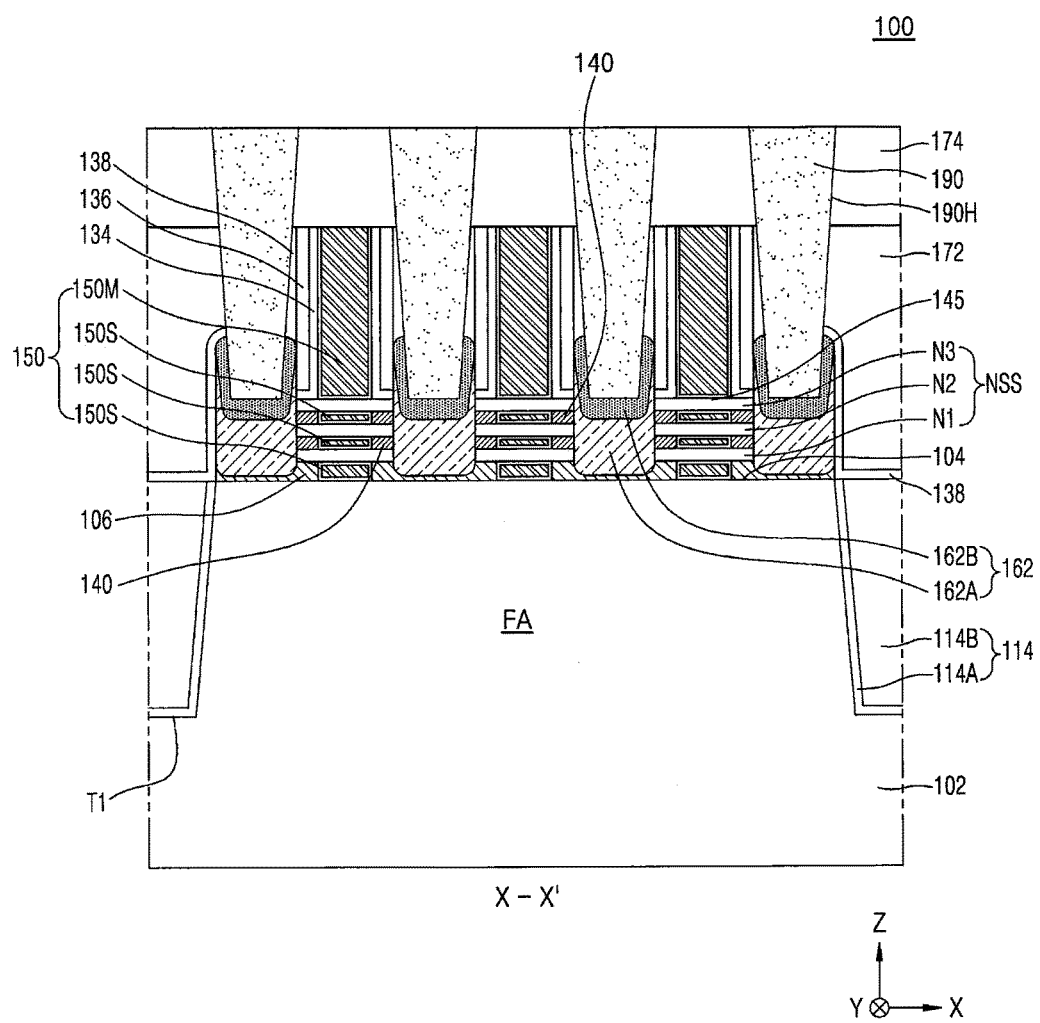

Referring to FIG. 26, after an interlayer insulating layer 174 covering the gate 150 and the inter-gate insulating layer 172 is formed, the interlayer insulating layer 174 and the inter-gate insulating layer 172 may be partially etched so that a plurality of contact holes 190H exposing the plurality of semiconductor layers 162A may be formed. Thereafter, the metal silicide layer 162B may be formed on an upper surface of the plurality of semiconductor layers 162A exposed through the plurality of contact holes 190H, and the plurality of contact plugs 190 respectively connected to the semiconductor layers 162A through the metal silicide layer 162B may be formed, and, thus, the integrated circuit device 100 illustrated in FIGS. 1A through 1C may be formed.

The method of manufacturing the integrated circuit device 100 described with reference to FIGS. 5 through 26 above may be used to form the integrated circuit device 100 including the plurality of second insulating spacers 140 contacting the source and drain regions 162 in spaces between the plurality of nanosheets N1, N2, and N3. In particular, the plurality of second insulating spacers 140 may be formed as a multilayer structure, or the plurality of second insulating spacers 140 may be formed to include air spaces if necessary. Thus, capacitance between the sub-gate portions 150S of the gates 150 and the source and drain regions 162 of the semiconductor layers 162A may be reduced, thereby easily implementing a structure that may reduce effective switching capacitance Ceff.

FIGS. 27 through 31 are cross-sectional views illustrating a method of manufacturing the integrated circuit device 200 based on a process order, according to other embodiments of the inventive concept. The method of manufacturing the integrated circuit device 200 illustrated in FIG. 3 will now be described with reference to FIGS. 27 through 31. In FIGS. 27 through 31, FIGS. 27, 28, 29A, 30A, and 31 are cross-sectional views of portions corresponding to cross-sections taken along the line X-X' of FIG. 3. In FIGS. 27 through 31, the same reference numerals are used to denote the same elements as in FIGS. 1A through 26, and detailed descriptions thereof are omitted.

Figure 27:
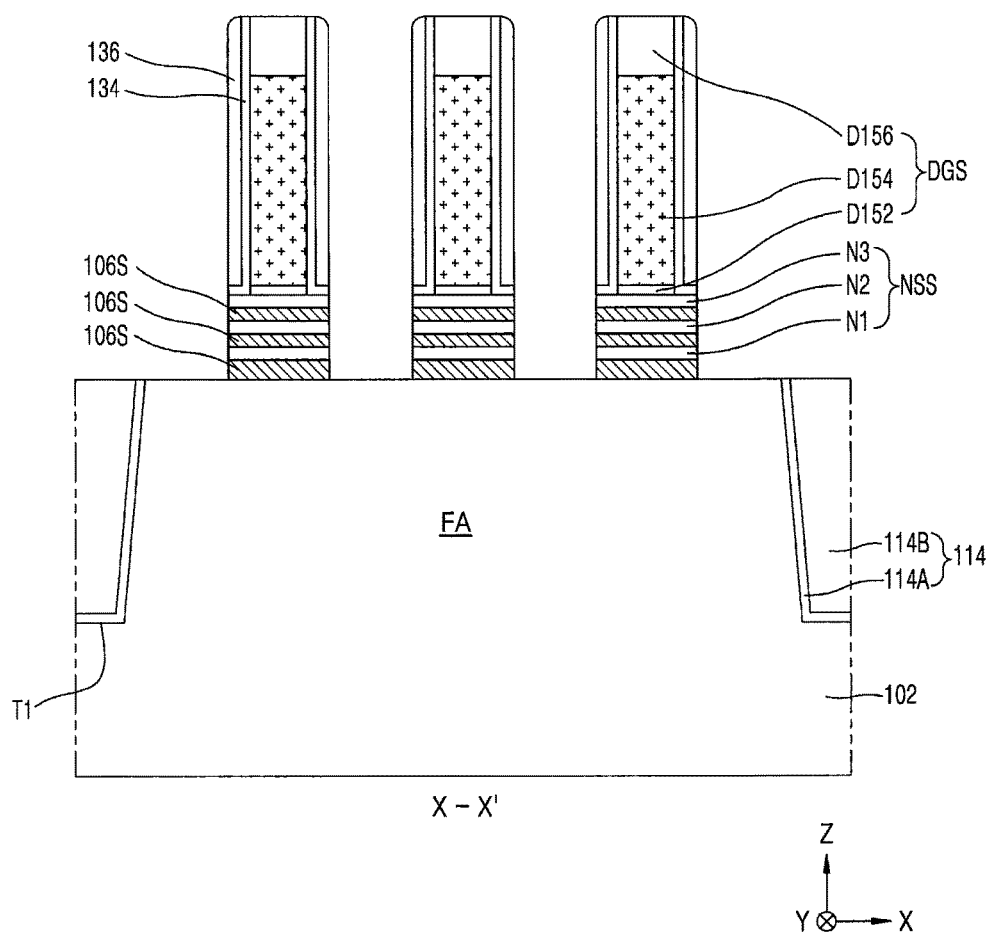
FIGS. 27 through 31 are cross-sectional views illustrating a method of manufacturing an integrated circuit device based on a process order, according to other embodiments of the inventive concept.

Referring to FIG. 27, processes described with reference to FIGS. 5 through 13 may be performed to form the plurality of nanosheet stack structures NSS including the plurality of nanosheets N1, N2, and N3 on the fin type active area FA.

However, differently from described with reference to FIG. 13, in the present example, an etching process may be performed until an upper surface of the fin type active area FA is exposed when a stack structure of the plurality of sacrifice semiconductor layers 106S and the plurality of nanosheet semiconductor layers NS is etched. Accordingly, after the plurality of nanosheet stack structures NSS is formed, the fin type active areas FA may be exposed between the plurality of nanosheet stack structures NSS.

Figure 28:
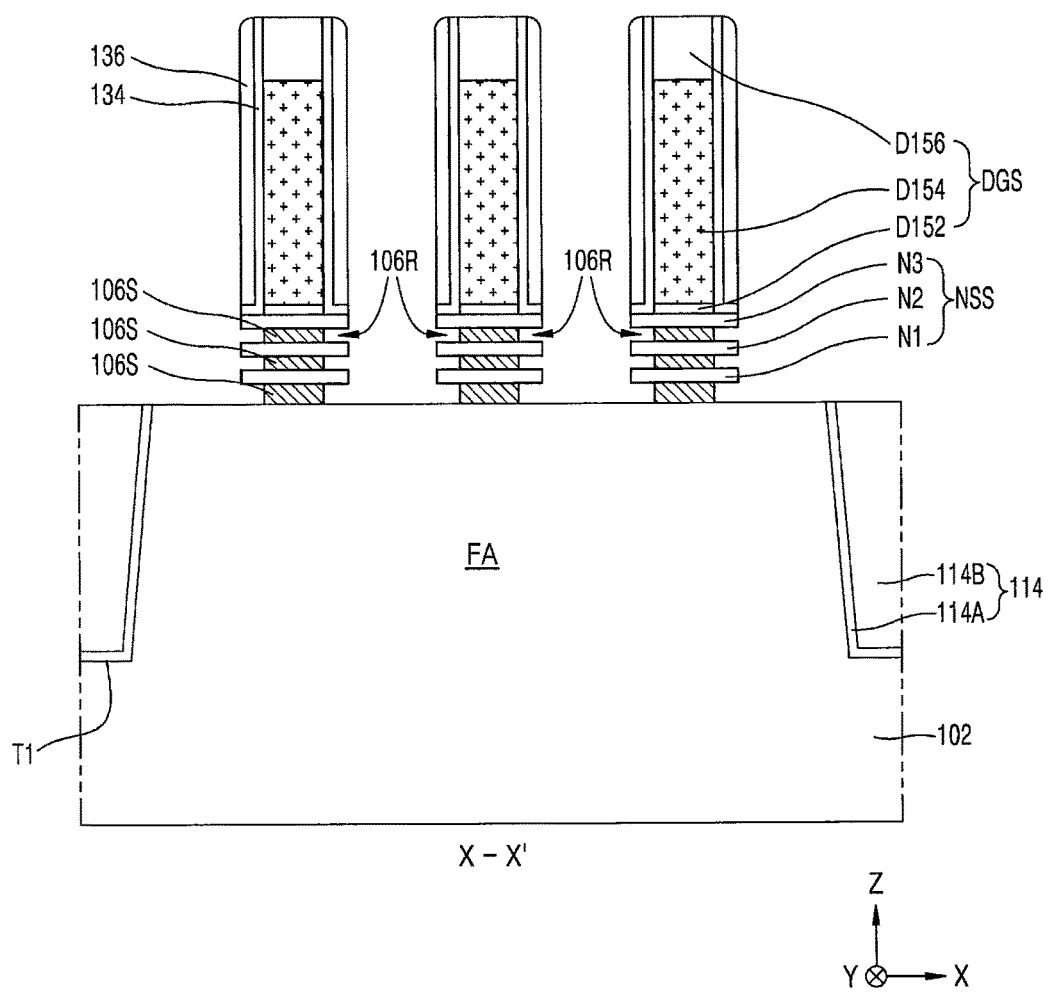

Referring to FIG. 28, in the same manner as described with reference to FIG. 14 above, some of the plurality of sacrifice semiconductor layers 106S exposed at both sides of each of the plurality of nanosheet stack structures NSS may be removed, and, thus, the recess regions 106R may be formed between the plurality of nanosheet stack structures NSS. However, in the present example, additional recess regions 106R may be formed between the nanosheet N1 that is the lowest layer of the plurality of nanosheet stack structures NSS and the fin type active area FA.

Figure 29A:
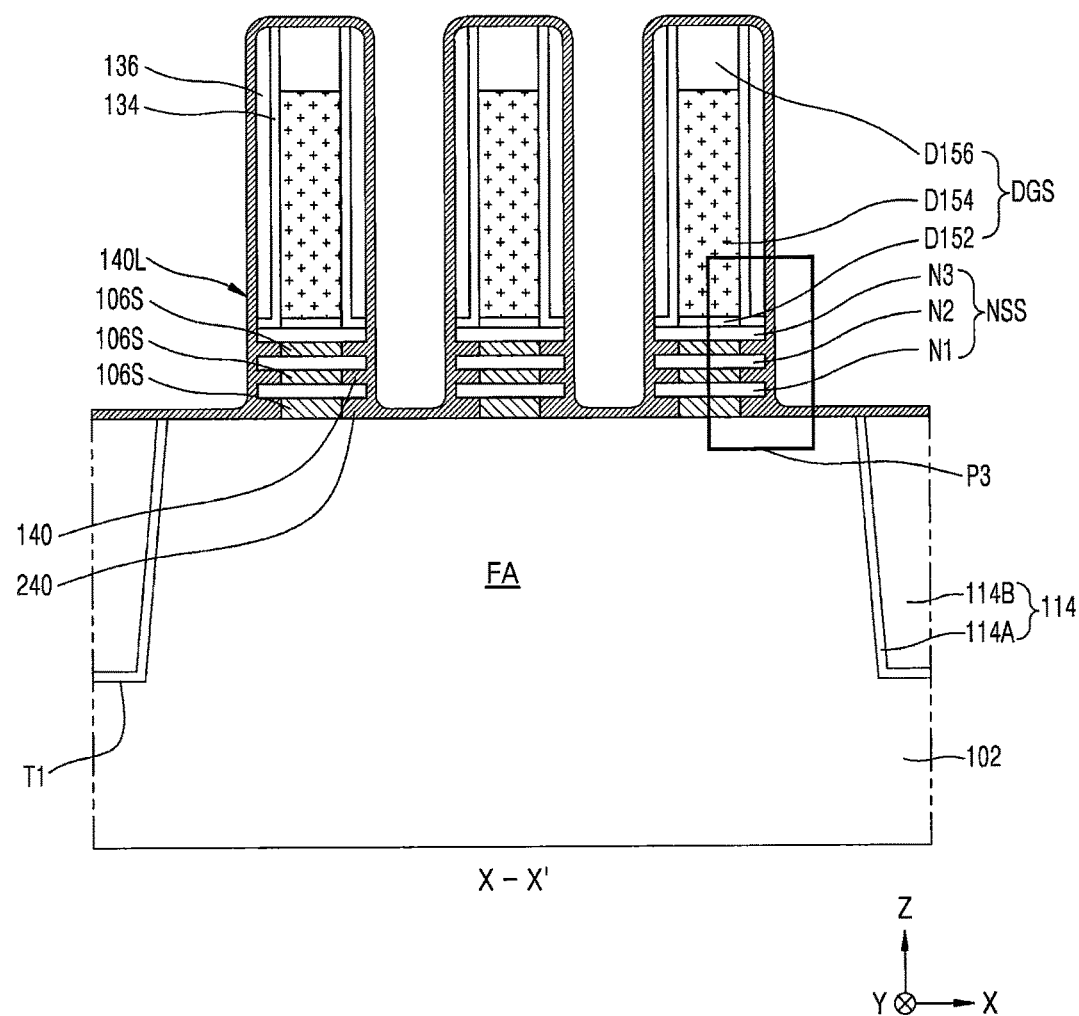

Referring to FIG. 29A, in a similar way as described with reference to FIG. 15A, the insulating structure 140L including the plurality of second insulating spacers 140 and 240 filling the recess regions 106R (see FIG. 28) may be formed. A thickness of the second insluting spacer 240 formed in the recess region 106R between the nanosheet N1 that is the lowest layer and the fin type active area FA may be greater than a thickness of the second insulating spacer 140 formed in the recess region 106R between the plurality of nanosheets N1, N2, and N3.

Figure 29B:
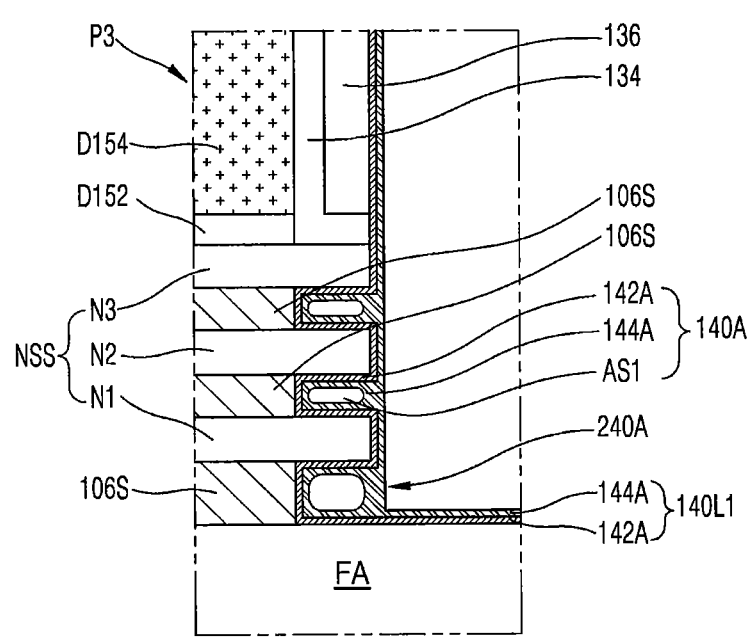
Figure 29C:
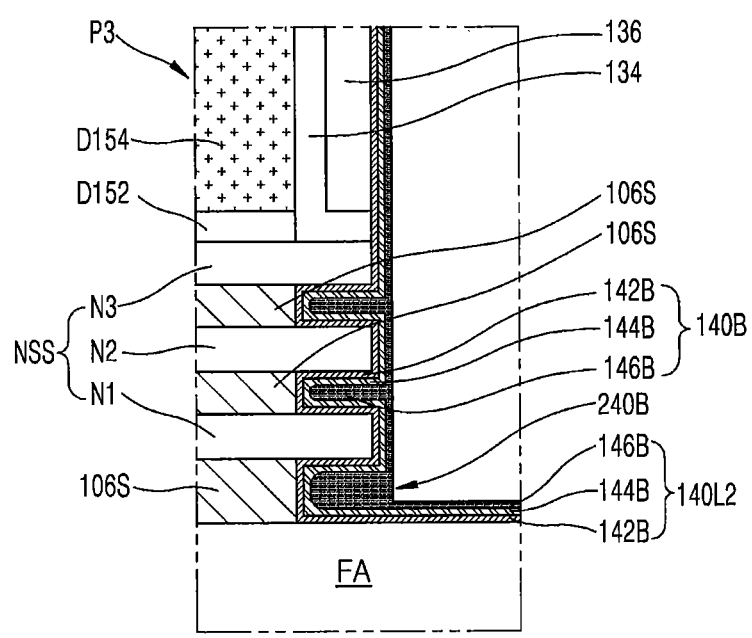
Figure 29D:
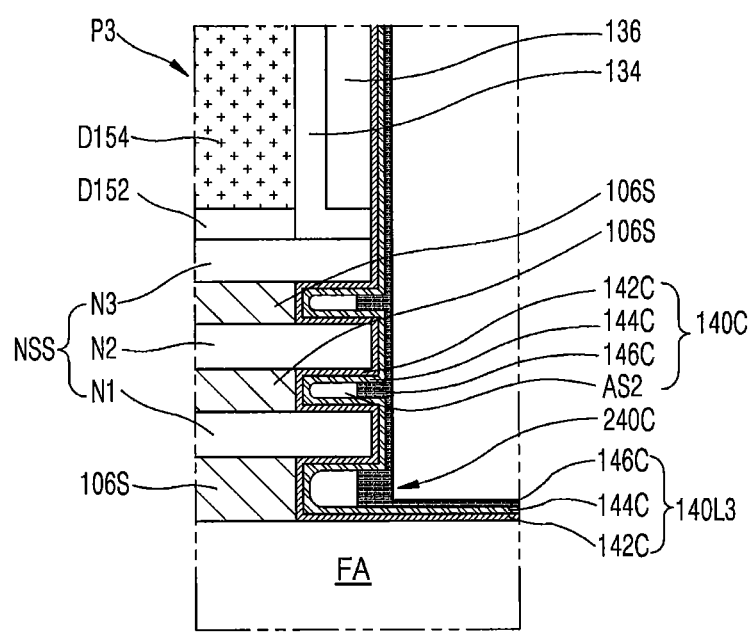

FIGS. 29B through 29D are cross-sectional views of various insulating structures 140L1, 140L2, and 140L3 that may be used as the insulating structure 140L including the plurality of second insulating spacers 140 and 240, by expanding a portion corresponding to an area P3 of FIG. 29A.

In some embodiments, to form the insulating structure 140L including the second insulating spacers 140 and 240 illustrated in FIG. 29A, in a similar way as described with reference to FIG. 15B, the insulating structure 140L1 including the second insulating spacer 140A and 240A illustrated in FIG. 29B may be formed.

The insulating structure 140L1 may be formed to include the air spaces AS1 in spaces between the plurality of nanosheets N1, N2, and N3 and a space between the upper surface of the fin type active area FA and the nanosheet N1 that is the lowest layer among the plurality of nanosheets N1, N2, and N3. In the insulating structure 140L1, the second insulating spacer 240A formed in the recess region 106R (see FIG. 28) between the nanosheet N1 that is the lowest layer among the plurality of nanosheets N1, N2, and N3 and the fin type active area FA may have generally the same configuration as the second insulating spacers 140A between the plurality of nanosheets N1, N2, and N3. However, a thickness of the second insulating spacer 240A may be greater than a thickness of the second insulating spacer 140A.

In some other embodiments, to form the insulating structure 140L including the second insulating spacers 140 and 240 illustrated in FIG. 29A, in a similar way as described with reference to FIG. 15C, the insulating structure 140L2 including the second insulating spacer 140B and 240B illustrated in FIG. 29C may be formed. In the insulating structure 140L2, the second insulating spacer 240B formed in the recess region 106R (see FIG. 28) between the nanosheet N1 that is the lowest layer among the plurality of nanosheets N1, N2, and N3 and the fin type active area FA may have generally the same configuration as the second insulating spacers 140B between the plurality of nanosheets N1, N2, and N3. However, a thickness of the second insulating spacer 240B may be greater than a thickness of the second insulating spacer 140B.

In some other embodiments, to form the insulating structure 140L including the second insulating spacers 140 and 240 illustrated in FIG. 29A, in a similar way as described with reference to FIG. 15D, the insulating structure 140L3 including the second insulating spacer 140C and 240C illustrated in FIG. 29D may be formed.

The insulating structure 140L3 may be formed to include the air spaces AS2 in spaces between the plurality of nanosheets N1, N2, and N3 and a space between the upper surface of the fin type active area FA and the nanosheet N1 that is the lowest layer among the plurality of nanosheets N1, N2, and N3. In the insulating structure 140L3, the second insulating spacer 240C formed in the recess region 106R (see FIG. 28) between the nanosheet N1 that is the lowest layer among the plurality of nanosheets N1, N2, and N3 and the fin type active area FA may have generally the same configuration as the second insulating spacers 140C between the plurality of nanosheets N1, N2, and N3. However, a thickness of the second insulating spacer 240C may be greater than a thickness of the second insulating spacer 140C.

Figure 30A:
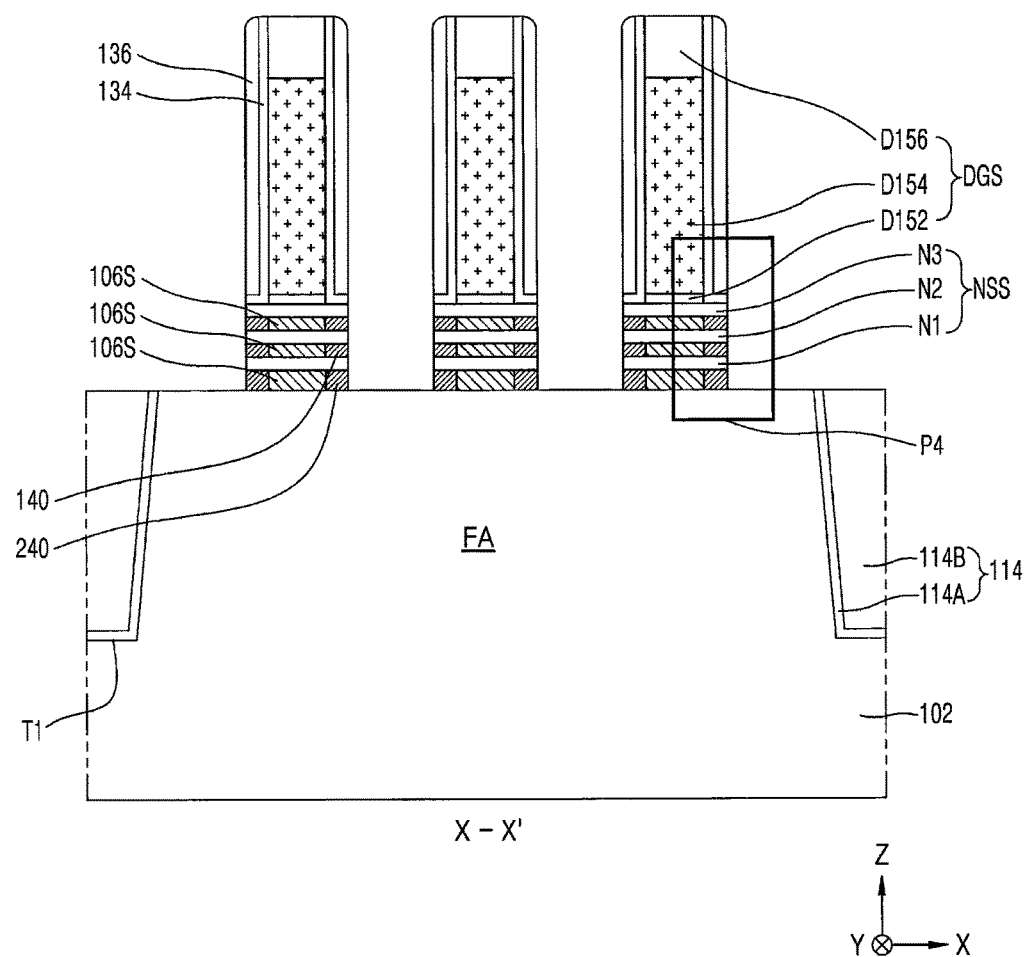

Referring to FIG. 30A, in a similar way as described with reference to FIG. 16A, the second insulating spacers 140 and 240 filling the recess regions 106R may remain by removing portions of the insulating structure 140L (see FIG. 29A) outside the recess regions 106R (see FIG. 28).

Figure 30B:
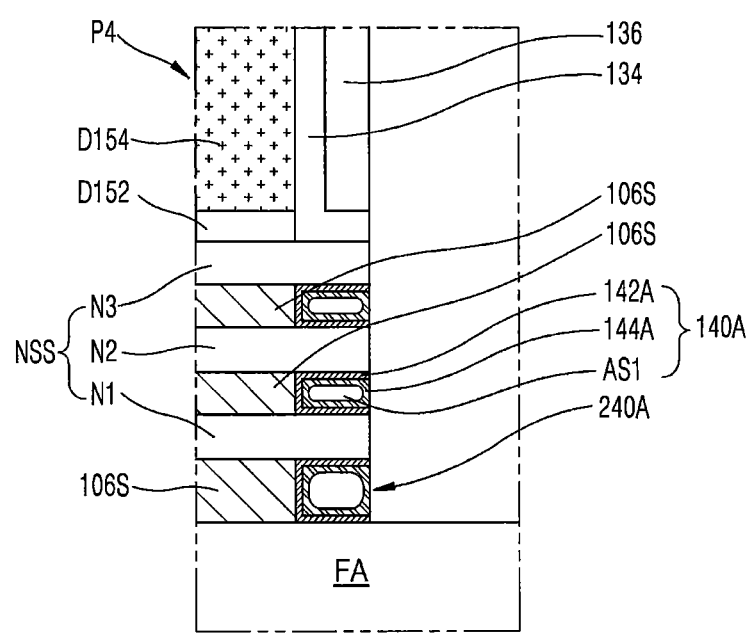
Figure 30C:
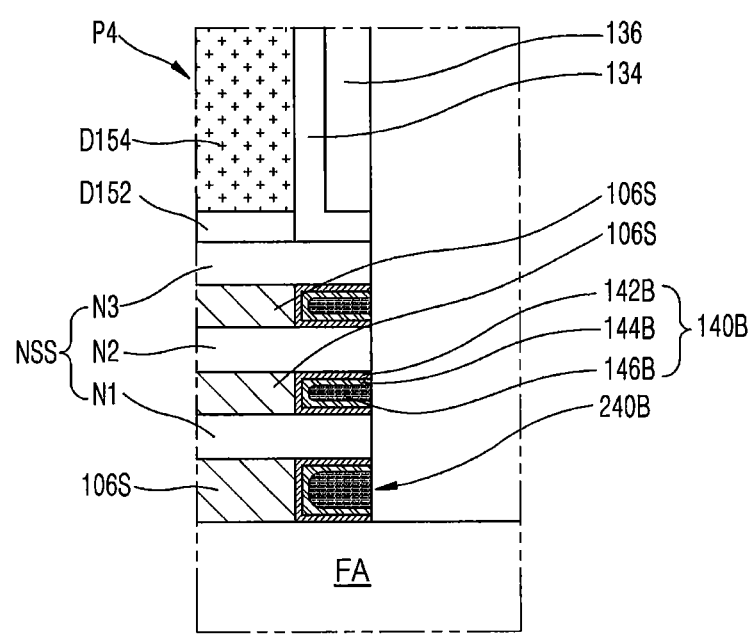
Figure 30D:
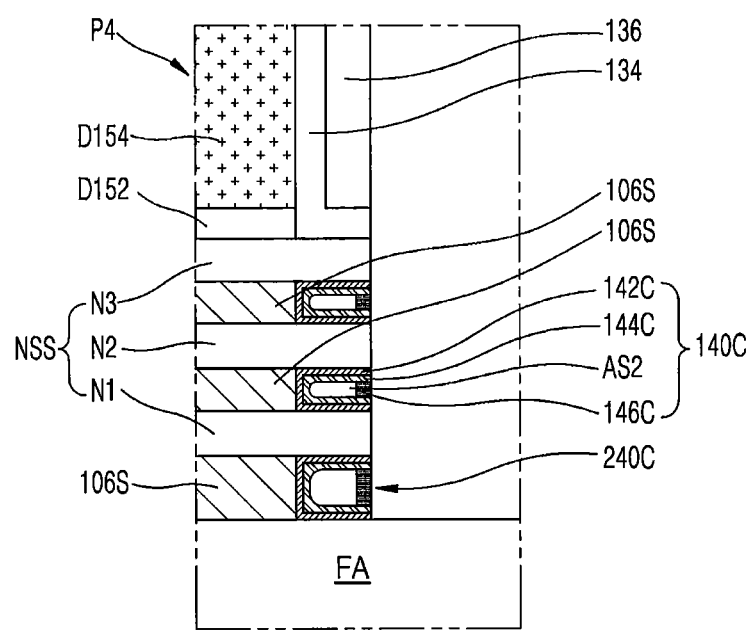

FIGS. 30B through 30D are cross-sectional views of various configurations obtained after removing the portions of the insulating structure 140L outside the recess regions 106R (see FIG. 28), by expanding a portion corresponding to an area P4 of FIG. 30A.

Referring to FIGS. 30B through 30D, the second insulating spacers 140A, 140B, and 140C may be formed in the recess regions 106R (see FIG. 28) between the plurality of nanosheets N1, N2, and N3, and the second insulating spacers 240A, 240B, and 240C may be formed in the recess regions 106R (see FIG. 28) between the nanosheet N1 that is the lowest layer among the plurality of nanosheets N1, N2, and N3 and the fin type active area FA.

Figure 31:
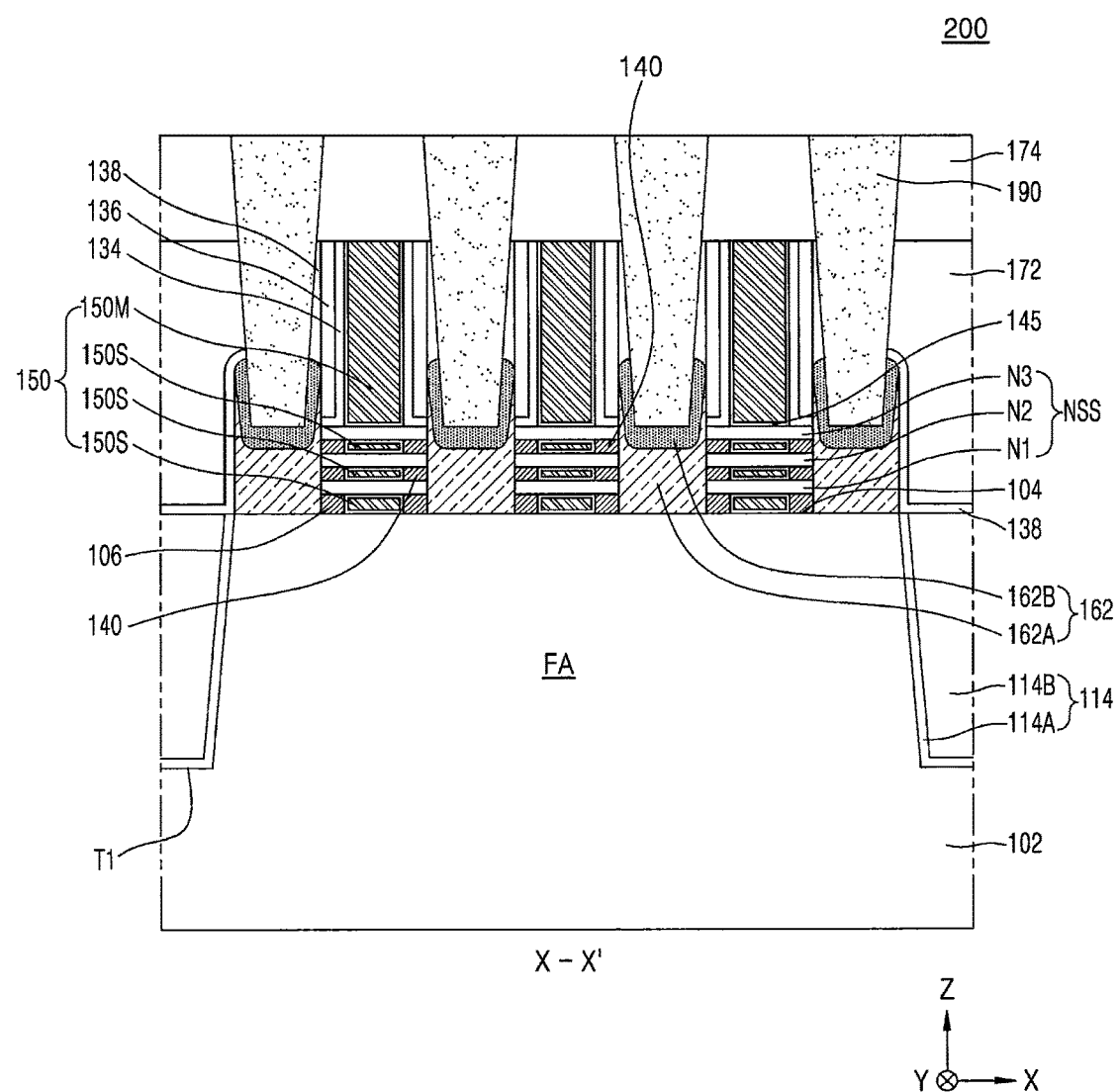

Referring to FIG. 31, processes described with reference to FIGS. 17 through 26 may be performed on a resultant structure of FIG. 30A, and, thus, the integrated circuit device 200 may be formed.

The method of manufacturing the integrated circuit device 200 described with reference to FIGS. 27 through 31 above may be used to form the integrated circuit device 200 including the plurality of second insulating spacers 140 and 240 contacting the source and drain regions 162 in spaces between the plurality of nanosheets N1, N2, and N3 and a space between the nanosheet N1 that is the lowest layer among the plurality of nanosheets N1, N2, and N3 and the fin type active area FA. In particular, the plurality of second insulating spacers 140 and 240 may be formed as a multi-layer structure, or the plurality of second insulating spacers 140 and 240 may be formed to include air spaces if desired. Thus, capacitance between the sub-gate portions 150S of the gates 150 and the source and drain regions 162 may be reduced, thereby implementing a structure for reducing effective switching capacitance Ceff.

Although the methods of manufacturing the integrated circuit device 100 illustrated in FIGS. 1A through 1C and the integrated circuit device 200 illustrated in FIG. 3 are described with reference to FIGS. 5 through 31 above, it will be understood to one of ordinary skill in the art that various integrated circuit devices having similar structures to those of the integrated circuit devices 100 and 200 may be manufactured through various modifications and changes within the scope of the inventive concept.

Integrated circuit devices including transistors having nanosheet channel areas formed on three-dimensional structure fin type active areas and methods of manufacturing the integrated circuit devices are described with reference to FIGS. 1A through 31, but the embodiments of the inventive concept are not limited thereto. For example, it will be understood to one of ordinary skill in the art that integrated circuit devices including planar MOSFETs having characteristics of the embodiments of the inventive concept and methods of manufacturing the integrated circuit devices may be provided through various modifications and changes within the scope of the inventive concept.

Figure 32:
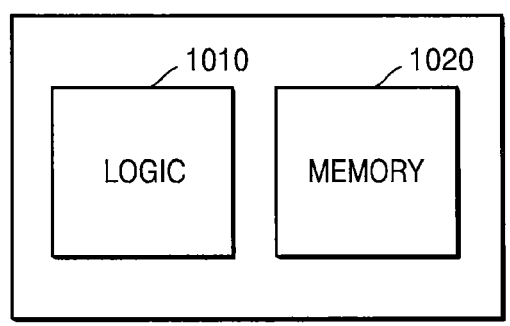
FIG. 32 is a block diagram of an electronic device according to embodiments of the inventive concept.

FIG. 32 is a block diagram of an electronic device 1000 according to embodiments of the inventive concept.

Referring to FIG. 32, the electronic device 1000 may include a logic area 1010 and a memory area 1020.

The logic area 1010 may include various kinds of logic cells including a plurality of circuit elements, such as transistors, registers, etc., as standard cells performing desired logic functions, such as a counter, a buffer, etc. The logic cell may be configured to implement such logical functions as, e.g., AND, NAND, OR, NOR, XOR (exclusive OR), XNOR (exclusive NOR), INV (inverter), ADD (adder), BUF (buffer), DLY (delay), FILL (filter), multiplexer (MXT/MXIT), OAI (OR/AND/INVERTER), AO (AND/OR), AOI (AND/OR/INVERTER), D flip-flop, reset flip-flop, master-slaver flip-flop, latch, etc. However, the logic cells according to the embodiments of the inventive concept are not limited to the above examples.

The memory area 1020 may include at least one of SRAM, DRAM, MRAM, RRAM, and PRAM.

The logic area 1010 and the memory area 1020 may respectively include at least one of the integrated circuit devices 100 and 200 illustrated in FIGS. 1A through 4C and other integrated circuit devices having various structures modified and changed from the above integrated circuit devices 100 and 200 within the scope of the inventive concept.

Figure 33:
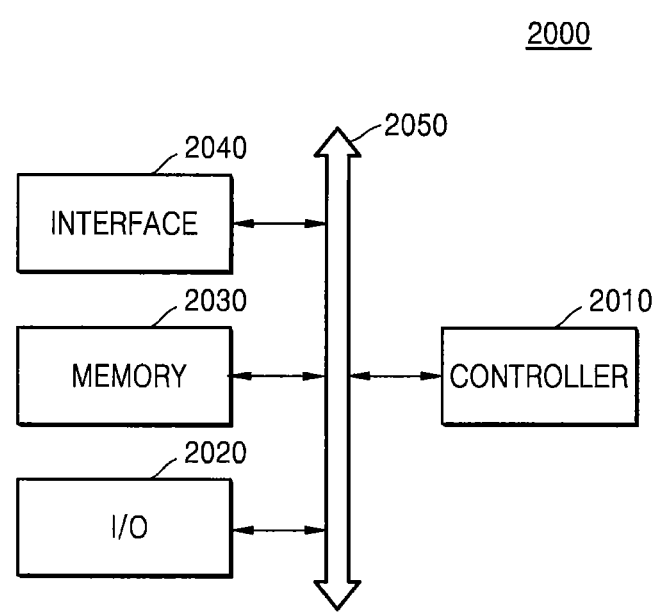
FIG. 33 is a block diagram of an electronic system according to embodiments of the inventive concept.

FIG. 33 is a block diagram of an electronic system 2000 according to embodiments of the inventive concept.

Referring to FIG. 33, the electronic system 2000 may include a controller 2010, an input/output (I/O) device 2020, a memory 2030, and an interface 2040 that are connected to one another via a bus 2050.

The controller 2010 may include at least one of a microprocessor, a digital signal processor, and other similar processors. The I/O device 2020 may include at least one of a keypad, a keyboard, and a display. The memory 2030 may be used to store a command executed by the controller 2010. For example, the memory 2030 may be used to store user data.

The electronic system 2000 may be used to configure a wireless communication device, or a device capable of transmitting and/or receiving information under a wireless communication environment. The interface 2040 may include a wireless interface in order to transmit/receive data via a wireless communication network in the electronic system 2000. The interface 2040 may include an antenna and/or a wireless transceiver. In some embodiments, the electronic system 2000 may be used for a communication interface protocol of a third-generation communication system, e.g., code division multiple access (CDMA), global system for mobile communications (GSM), north American digital cellular (NADC), extended-time division multiple access (E-TDMA), and/or wide band code division multiple access (WCDMA). The electronic system 2000 may include at least one of the integrated circuit devices 100 and 200 illustrated in FIGS. 1A through 4C and other integrated circuit devices having various structures modified and changed from the above integrated circuit devices 100 and 200 within the scope of the inventive concept.

While the inventive concept has been particularly shown and described with reference to embodiments thereof, it will be understood that various changes in form and details may be made therein without departing from the spirit and scope of the following claims.

What is claimed is:

1. An integrated circuit device comprising:
    a fin type active area protruding in a vertical direction from a substrate and having an upper surface at a first level;
    a nanosheet extending in parallel to the upper surface of the fin type active area and comprising a channel area, the nanosheet being located at a second level spaced apart from the upper surface of the fin type active area;
    a gate disposed on the fin type active area and surrounding at least a part of the nanosheet, the gate extending in a direction crossing the fin type active area;
    a gate dielectric layer disposed between the nanosheet and the gate;
    a source and drain region formed on the fin type active area and connected to one end of the nanosheet;
    a first insulating spacer on the nanosheet, the first insulating spacer covering sidewalls of the gate; and
    a second insulating spacer disposed between the gate and the source and drain region in a space between the upper surface of the fin type active area and the nanosheet, the second insulating spacer having at least a triple layer structure and not overlapping the source and drain region in the vertical direction.

2. The integrated circuit device of claim 1,
    wherein the gate comprises a main gate portion covering an upper surface of the nanosheet and a sub-gate portion connected to the main gate portion and formed in a space between the fin type active area and the nanosheet, wherein the first insulating spacer covers sidewalls of the main gate portion, and wherein the second insulating spacer covers sidewalls of the sub-gate portion.

3. The integrated circuit device of claim 2, wherein the nanosheet is formed in an overlap region covered by the gate in a space between the fin type active area and the gate and has a planar area greater than a planar area of the overlap region.

4. The integrated circuit device of claim 1, wherein the first insulating spacer and the second insulating spacer comprise different materials.

5. The integrated circuit device of claim 1, wherein the second insulating spacer comprises an air space.

6. The integrated circuit device of claim 1, herein the second insulating spacer comprises:
a first liner comprising one of SiN, SiCN, and SiBN; and
a second liner spaced apart from the gate and the nanowire and comprising one of SiON, SiOCN, and SiBCN, wherein the first liner is between the second liner and the gate and between the second liner and the nanowire.

7. The integrated circuit device of claim 1, wherein the second insulating spacer comprises:
a first liner comprising a first insulating material that does not comprise oxygen; and
a second liner having a composition different from a composition of the first insulating material and having an oxygen content ranging from 0 to about 50 atom %.

8. The integrated circuit device of claim 1, wherein the second insulating spacer comprises at least one of an air space, SiN, SiCN, SiBN, SiON, SiOCN, SiBCN, SiOC, and SiO$_2$.

9. The integrated circuit device of claim 1,
wherein the first insulating spacer comprises SiN, and
wherein the second insulating spacer comprises an insulating layer contacting the source and drain region and comprising SiON.

10. An integrated circuit device comprising:
a fin type active area protruding in a vertical direction from a substrate and extending in a first direction;
at least one nanosheet stack structure facing and spaced apart from an upper surface of the fin type active area, the at least one nanosheet stack structure comprising a plurality of nanosheets each having a channel area;
at least one gate disposed on the fin type active area and covering the at least one nanosheet stack structure, the at least one gate extending in a direction crossing the first direction;
at least one gate dielectric layer disposed between the at least one nanosheet stack structure and the at least one gate;
source and drain regions connected to the plurality of nanosheets; and
insulating spacers each having at least a triple layer structure, contacting the source and drain regions in spaces between the plurality of nanosheets, and not overlapping the source and drain regions in the vertical direction.

11. The integrated circuit device of claim 10, wherein the at least one gate comprises a main gate portion on the plurality of nanosheets and a sub-gate portion filling the spaces between the plurality of nanosheets, the main gate portion having a first thickness and the sub-gate portion having a second thickness smaller than the first thickness, and
wherein the insulating spacers cover sidewalls of the sub-gate portion.

12. The integrated circuit device of claim 10, wherein the insulating spacers comprise an air space.

13. The integrated circuit device of claim 10, wherein the insulating spacers comprise:
a first liner spaced apart from the source and drain regions and comprising a first insulating material that does not comprise oxygen; and
a second liner contacting the source and drain regions, the second liner having a composition different from a composition of the first insulating material and having an oxygen content ranging from 0 to about 50 atom %.

14. The integrated circuit device of claim 10, wherein the plurality of nanosheets is in at least one overlap region covered by the at least one gate, among spaces between the fin type active area and the at least one gate, and has a planar area greater than a planar area of the at least one overlap region.

15. The integrated circuit device of claim 10, wherein the at least one nanosheet stack structure comprises a plurality of nanosheet stack structures and the at least one gate comprises a plurality of gates, wherein the plurality of nanosheet stack structures are arranged in a line along the first direction on the fin type active area and each comprises a plurality of the nanosheets; and
wherein the plurality of gates extend in parallel to each other on the fin type active area, the plurality of nanosheet stack structures being arranged between the fin type active area and the plurality of gates.

16. An integrated circuit device, comprising:
a substrate;
a fin type active area that protrudes in a vertical direction from the substrate;
a plurality of source and drain regions on the in type active area;
a plurality of nanosheets that are adjacent to the plurality of source and drain regions, the plurality of source and drain regions being respectively connected to opposing ends of the plurality of nanosheets; and
a plurality of insulating spacers between ones of the plurality of nanosheets, each of the plurality of insulating spacers having at least a triple layer structure and not overlapping the plurality of source and drain regions in the vertical direction.

17. The integrated circuit device of claim 16, wherein the at least the triple layer structure comprises at least one of an air space, SiN, SiCN, SiBN, SiON, SIOCN, SiBCN, SiOC, and SiO$_2$.

18. The integrated circuit device of claim 16, further comprising a gate comprising a main gate portion and a plurality of sub-gate portions;
wherein the main gate portion is on the plurality of nanosheets and the plurality of sub-gate portions is between the fin type active area and the plurality of nanosheets.

19. The integrated circuit device of claim 18, wherein the plurality of insulating spacers is a plurality of nanosheet insulating spacers, the integrated circuit device further comprising:
insulating liners on sidewalls of the main gate portion;
gate insulating spacers on sidewalls on the insulating liners; and
protection layers on the insulating liners;
wherein the gate insulating spacers and the nanosheet insulating spacers comprise different materials.

20. The integrated circuit device of claim 18, wherein the multi-layer structure comprises:
a first liner, a second liner, and an air space;

wherein the first liner is between a respective one of the plurality of sub-gate portions, and the second liner and the air space is at least partially limited by the second liner; and wherein the first liner and the second liner comprise different materials.

* * * * *